(12) United States Patent
Zhuang et al.

(10) Patent No.: US 11,315,953 B2
(45) Date of Patent: Apr. 26, 2022

(54) SUBSTRATE AND METHOD FOR MANUFACTURING THE SAME, AND DISPLAY DEVICE

(71) Applicants: Fuzhou BOE Optoelectronics Technology Co., Ltd., Fujian (CN); BOE TECHNOLOGY GROUP CO., LTD., Beijing (CN)

(72) Inventors: Zihua Zhuang, Beijing (CN); Lizhong Wang, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 17/039,568

(22) Filed: Sep. 30, 2020

(65) Prior Publication Data

US 2021/0098504 A1 Apr. 1, 2021

(30) Foreign Application Priority Data

Sep. 30, 2019 (CN) .......................... 201910941144.X

(51) Int. Cl.
*H01L 27/14* (2006.01)
*H01L 27/12* (2006.01)

(52) U.S. Cl.
CPC ........ *H01L 27/1222* (2013.01); *H01L 27/127* (2013.01); *H01L 27/1251* (2013.01); *H01L 27/1255* (2013.01)

(58) Field of Classification Search
CPC ............. H01L 27/1222; H01L 27/1251; H01L 27/1255; H01L 27/127
USPC ............................................. 257/59, 72, 432
See application file for complete search history.

(56) References Cited

U.S. PATENT DOCUMENTS

2018/0285617 A1   10/2018   Liu et al.
2019/0005295 A1   1/2019    Jia et al.
2021/0066267 A1*  3/2021    Li .......................... H01L 27/124

FOREIGN PATENT DOCUMENTS

CN   106129069 A   11/2016
CN   106611170 A   5/2017
CN   109670475 A   4/2019
CN   110197834 A   9/2019

OTHER PUBLICATIONS

Office Action dated Jun. 28, 2021 from corresponding CN Patent Application No. 201910941144.X, 13 pages.

* cited by examiner

*Primary Examiner* — Tan N Tran
(74) *Attorney, Agent, or Firm* — Procopio, Cory, Hargreaves & Savitch LLP

(57) ABSTRACT

A substrate includes a base, a first insulating layer and a plurality of texture identifiers. The first insulating layer is disposed on the base and includes a plurality of via holes extending toward the base from a surface of the first insulating layer facing away from the base. The plurality of texture identifiers are disposed on the base. At least a part of each texture identifier is located within a respective one of the plurality of via holes. The texture identifier is configured to detect texture information.

12 Claims, 14 Drawing Sheets

SUBSTRATE AND METHOD FOR MANUFACTURING THE SAME, AND DISPLAY DEVICE

CROSS-REFERENCE TO RELATED APPLICATION

This application claims priority to Chinese Patent Application No. 201910941144.X, filed on Sep. 30, 2019, which is incorporated herein by reference in its entirety.

TECHNICAL FIELD

The present disclosure relates to the field of display technologies, and in particular, to a substrate and a method for manufacturing the same, and a display device.

BACKGROUND

An under-screen fingerprint identification technology is a technology for collecting texture information (e.g., fingerprint information) by using texture identifiers disposed under a touch screen and identifying the collected texture information. At present, the under-screen fingerprint identification technology is widely used in fingerprint locks, fingerprint attendance machines and various display devices.

SUMMARY

In one aspect, a substrate is provided. The substrate includes a base, and a first insulating layer and a plurality of texture identifiers that are disposed on the base. The first insulating layer includes a plurality of via holes extending toward the base from a surface of the first insulating layer facing away from the base. At least a part of each texture identifier is located within a respective one of the plurality of via holes. The texture identifier is configured to detect texture information.

In some embodiments, the substrate further includes a plurality of first thin film transistors disposed on the base. At least one first thin film transistor includes a first gate, a first active pattern, a portion of the first insulating layer located in the first thin film transistor, a first source and a first drain. And one of the first source and the first drain is electrically connected to at least one corresponding texture identifier.

In some embodiments, the plurality of via holes penetrate the first insulating layer. The texture identifier includes a first electrode, a texture identification functional layer and a second electrode. The first electrode is disposed on a side of the first insulating layer proximate to the base. The texture identification functional layer is disposed on a surface of the first electrode facing away from the base, at least a part of the texture identification functional layer is disposed in a corresponding via hole. The second electrode is disposed on a surface of the texture identification functional layer facing away from the base. An area of an orthographic projection of the first electrode on the base is greater than an area of an orthographic projection of the second electrode on the base. The first insulating layer is disposed between the first electrode and a layer including the first source and the first drain. The first insulating layer has a plurality of first through holes, and one of the first source and the first drain is electrically connected to a corresponding first electrode through a corresponding first through hole.

In some embodiments, the substrate further includes a plurality of second storage electrodes, each second storage electrode is disposed between the first electrode and the base. In the thickness direction of the base, the orthographic projection of the first electrode on the base overlaps with an orthographic projection of the second storage electrode on the base.

In some embodiments, the second storage electrode and the first gate are disposed in a same layer, and are made of a same material. Or, the second storage electrode and the first active pattern are disposed in a same layer; the first active pattern has a first channel region, and a first source region and a first drain region that are located on two opposite sides of the first channel region, and an orthographic projection of a portion of the first active pattern located in the first channel region on the base overlaps with an orthographic projection of the first gate on the base. The first source is electrically connected to a portion of the first active pattern located in the first source region, and the first drain is electrically connected to a portion of the first active pattern located in the first drain region. The second storage electrode, the portion of the first active pattern located in the first source region, and the portion of the first active pattern located in the first drain region are made of a same material.

In some embodiments, the substrate further includes a plurality of pixel driver circuits disposed on the base, at least one pixel driver circuit includes at least one second thin film transistor. The second thin film transistor includes a second gate, a second active pattern, a portion of the first insulating layer located in the second thin film transistor, a second source and a second drain. The second gate and the first gate are disposed in a same layer, the second active pattern and the first active pattern are disposed in a same layer, and the second source, the second drain, the first source and the first drain are disposed in a same layer.

In some embodiments, the pixel driver circuit further includes a third storage electrode. In the thickness direction of the base, an orthographic projection of the third storage electrode on the base overlaps with an orthographic projection of the second gate on the base. The second thin film transistor is a driving transistor.

In some embodiments, the second gate is disposed on a side of the second active pattern away from the base. The third storage electrode is disposed on a side of the second gate away from the base, and the third storage electrode is disposed in a same layer as the first electrode.

In some embodiments, the third storage electrode is disposed on a surface of the first insulating layer proximate to the base. The substrate further includes a first gate insulating layer disposed between the third storage electrode and the second gate.

In some embodiments, the substrate further includes a plurality of light-emitting devices disposed on a side of the plurality of pixel driver circuits away from the base. An anode of each light-emitting device is electrically connected to a corresponding pixel driver circuit.

In some embodiments, the substrate further includes a planarization layer disposed on a side of the plurality of texture identifiers away from the base. In the thickness direction of the base, a thickness of the planarization layer is in a range of 1.2 μm to 1.8 μm.

In some embodiments, the substrate further includes a protective layer disposed on a surface of the planarization layer proximate to the base. The protective layer is made of an inorganic insulating material, and the planarization layer is made of an organic insulating material.

In another aspect, a display device is provided. The display device includes the above substrate.

In yet another aspect, a method for manufacturing the above substrate is provided. The method includes: forming the first insulating layer on the base, the first insulating layer including a plurality of via holes extending toward the base from a surface of the first insulating layer facing away from the base; and forming the plurality of texture identifiers on the base, at least a part of each texture identifier being located within a corresponding via hole in the thickness direction of the base.

In some embodiments, the method further includes: forming a plurality of first thin film transistors on the base. Each first thin film transistor includes a first gate, a first active pattern, a portion of the first insulating layer located in the first thin film transistor, a first source and a first drain. One of the first source and the first drain is electrically connected to at least one corresponding texture identifier.

In some embodiments, the first source and the first drain are formed directly after the first insulating layer is formed. Before forming the first insulating layer, the method further includes: forming a plurality of first storage capacitors, each first storage capacitor including a second storage electrode and a first storage electrode that are sequentially formed on the base in the thickness direction of the base. After forming the first insulating layer, forming the plurality of texture identifiers includes: forming texture identification functional layers each on a corresponding first storage capacitor; and forming second electrodes each on a corresponding texture identification functional layer.

In some embodiments, forming the second storage electrode and the first gate includes: forming a metal film on the base; and performing a patterning process on the metal film to form the second storage electrode and the first gate.

In some embodiments, forming the second storage electrode, the first active pattern and the first gate includes: forming a semiconductor film on the base; performing a patterning process on the semiconductor film to form a semiconductor layer, the semiconductor layer including a first semiconductor pattern and a first transition pattern; forming a second gate insulating film on the base on which the semiconductor layer has been formed; forming the first gate on the base on which the second gate insulating film has been formed, an orthographic projection of the first gate on the base overlapping with an orthographic projection of a portion of the first semiconductor pattern on the base; and performing a conductivizing process on a portion of the first semiconductor pattern that is not covered by the first gate and the first transition pattern, to respectively form the first active pattern and the second storage electrode.

In some embodiments, the method further includes: forming a plurality of pixel driver circuits, each pixel driver circuit including at least one second thin film transistor; and each second thin film transistor including a second gate, a second active pattern, a portion of the first insulating layer located in the second thin film transistor, a second source and a second drain. The second gate and the first gate are formed through a same patterning process; the second active pattern, the first active pattern and the second storage electrode are formed through a same patterning process and a same conductivizing process; and the second source, the second drain, the first source and the first drain are formed through a same patterning process.

In some embodiments, the pixel driver circuit further includes a second storage capacitor. The second storage capacitor includes a fourth storage electrode and a third storage electrode that are sequentially formed on the base in the thickness direction of the base. The second thin film transistor is a driving transistor, and the fourth storage electrode is further used as the second gate. Forming the first thin film transistor, the second thin film transistor, the first storage electrode and the second storage electrode includes: forming the semiconductor film on the base; performing a first patterning process on the semiconductor film to form the semiconductor layer, the semiconductor layer including the first semiconductor patterns, the first transition patterns and second semiconductor patterns; forming the second gate insulating film on the base on which the semiconductor layer has been formed; forming a first metal film on the base on which the second gate insulating film has been formed, performing a second patterning process on the first metal film to form the first gate and the second gate, the orthographic projection of the first gate on the base overlapping with an orthographic projection of a portion of the first semiconductor pattern on the base, and an orthographic projection of the second gate on the base overlapping with an orthographic projection of a portion of the second semiconductor pattern on the base; performing a conductivizing process on the portion of the first semiconductor pattern that is not covered by the first gate, a portion of the second semiconductor pattern that is not covered by the second gate and the first transition pattern, so as to respectively form the first active pattern, the second active pattern and the second storage electrode; forming a first gate insulating film on the base on which the first active pattern, the second active pattern and the second storage electrode have been formed; forming a second metal film on the base on which the first gate insulating film has been formed, performing a third patterning process on the second metal film to form the first storage electrode and the third storage electrode; forming a first insulating film on the base on which the first storage electrode and the third storage electrode have been formed; performing a fourth patterning process on the first insulating film, the first gate insulating film and the second gate insulating film, so as to form the via holes and a first through hole penetrating the first insulating film, and a second through hole, a third through hole, a fourth through hole and a fifth through hole penetrating the first insulating film, the first gate insulating film and the second gate insulating film, thereby sequentially obtaining the first insulating layer, a first gate insulating layer and a second gate insulating layer; forming a third metal film on the base on which the first insulating film has been formed, and performing a fifth patterning process on the third metal film to form the first source, the first drain, the second source and the second drain, the first drain and the first source being in contact with a portion of the first active pattern that is not covered by the first gate through the second through hole and the third through hole respectively, the second drain and the second source being in contact with a portion of the second active pattern that is not covered by the second gate through the fourth through hole and the fifth through hole respectively, and one of the first drain and the first source being electrically connected to the first storage electrode through the first through hole.

BRIEF DESCRIPTION OF THE DRAWINGS

In order to explain technical solutions in the present disclosure more clearly, accompanying drawings used in some embodiments of the present disclosure will be introduced below briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1:
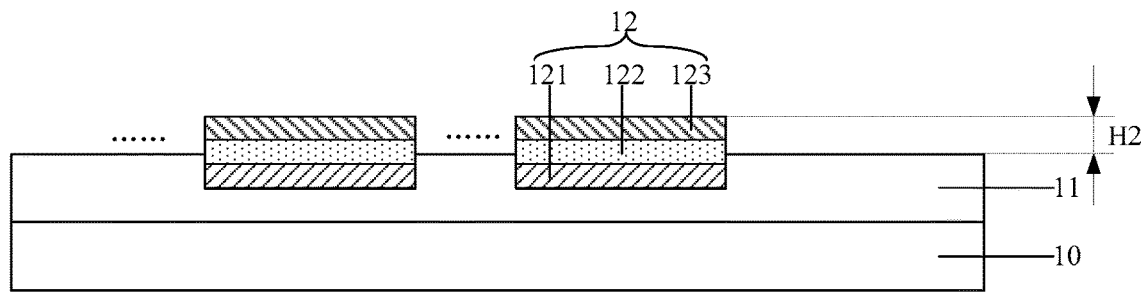
FIG. 1 is a schematic diagram showing a structure of a substrate, in accordance with some embodiments of the present disclosure.

Technical solutions in some embodiments of the present disclosure will be described below clearly and completely with reference to accompanying drawings. However, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising", in the description and the claims are construed as open and inclusive, i.e., "inclusive, but not limited to". In the description, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the terms "a plurality of" and "the plurality of" each mean two or more unless otherwise specified.

"A and/or B" includes the following three combinations: only A, only B, and a combination of A and B. "At least one of A, B, and C" has a same meaning as "at least one of A, B, or C", and they both include the following combinations of A, B, and C: only A, only B, only C, a combination of A and B, a combination of A and C, a combination of B and C, and a combination of A, B, and C.

That C and D are disposed in a same layer refers to that C and D are formed on a same bearing surface by a process as follows: a film is formed first by using a same film-forming process, and then a patterning process is performed on the film by using a same mask to form a layer structure with specific patterns including C and D. The patterning process may include exposure, development and/or etching processes, and the specific patterns in the formed layer structure may be continuous or discontinuous, and these specific patterns may also be at different heights or have different thicknesses.

In the description of some embodiments, the term such as "connected" and its extensions may be used. For example, the term "connected" may be used in the description of some embodiments to indicate that two or more elements are in direct physical or electrical contact with each other. However, the term "connected" may also mean that two or more elements are not in direct contact with each other but still cooperate or interact with each other. The embodiments disclosed herein are not necessarily limited to the content herein.

It can be understood that when a layer or element is referred to as being "on" another layer or substrate, it can be directly on the other layer or substrate, or intervening layers may also be present.

Figure 2:
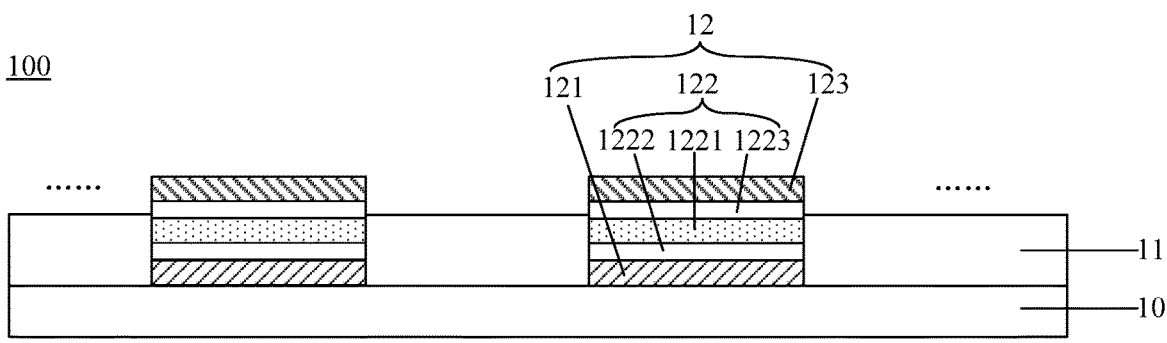
FIG. 2 is a schematic diagram showing a structure of another substrate, in accordance with some embodiments of the present disclosure.

Some embodiments of the present disclosure provide a substrate. With reference to FIGS. 1 and 2, the substrate 100 includes a base 10, and a first insulating layer 11 and a plurality of texture identifiers 12 that are disposed on the base 10.

Figure 3:
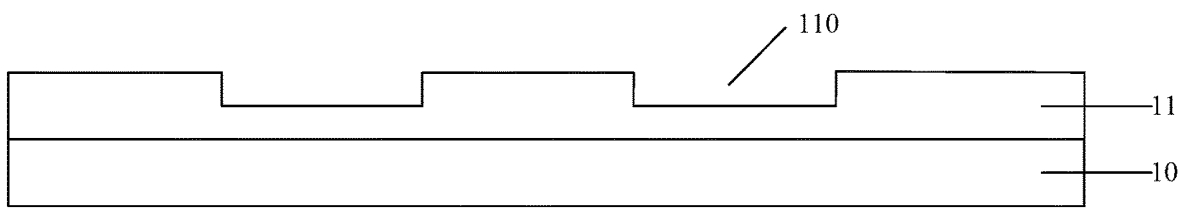
FIG. 3 is a schematic diagram showing a structure of a kind of via holes in a first insulating layer, in accordance with some embodiments of the present disclosure.
Figure 4:
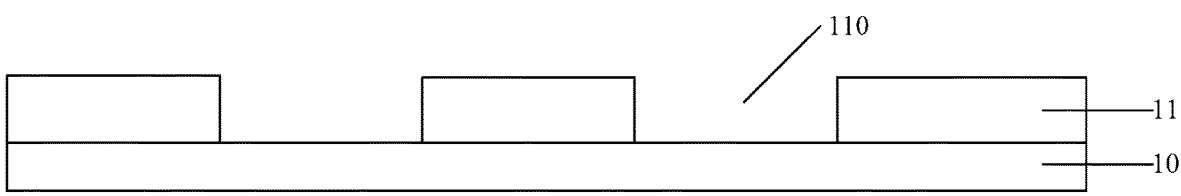
FIG. 4 is a schematic diagram showing a structure of another kind of via holes in a first insulating layer, in accordance with some embodiments of the present disclosure.

With reference to FIGS. 3 and 4, the first insulating layer 11 includes a plurality of via holes 110 extending toward the base 10 from a surface of the first insulating layer 11 facing away from the base 10. In a thickness direction of the base 10, the depth of the via hole 110 is less than or equal to a thickness of the first insulating layer 11. For example, a depth of each via hole 110 is less than or equal to the thickness of the first insulating layer 1. It will be understood that all the via holes 110 may have a same depth in actual process.

In some examples, as shown in FIG. 3, the via hole 110 is a blind hole (which may also be called a groove). The depth of the via hole 110 is less than the thickness of the first insulating layer 11 in the thickness direction of the base 10, and an opening of the via hole 110 faces away from the base 10.

In some other examples, as shown in FIG. 4, the via hole 110 is a through hole (which may also be called an opening). The depth of the via hole 110 is equal to the thickness of the first insulating layer 11 in the thickness direction of the base 10.

With continued reference to FIGS. 1 and 2, at least a part of each texture identifier 12 is located within a corresponding via hole 110 in the thickness direction of the base 10. The texture identifier 12 is configured to detect texture information of textures of an object to be detected. The object to be detected may be a human organ with texture features, such as a finger or a palm. Or, the object to be detected may be an object with texture features such as a mold with fingerprint textures. The texture information may include intensity of reflected light or other information.

With reference to FIGS. 1 and 2, the texture identifier 12 includes a first electrode 121, a texture identification functional layer 122 and a second electrode 123 that are stacked in the thickness direction of the base 10. The first electrode 121 is disposed on a side of the first insulating layer 11 proximate to the base 10, and the second electrode 123 is disposed on a side of the first electrode 121 away from the base 10.

In some examples, as shown in FIG. 2, the texture identification functional layer 122 includes an intrinsic layer 1221, an N-type doped layer 1222 disposed between the first electrode 121 and the intrinsic layer 1221, and a P-type doped layer 1223 disposed between the second electrode 123 and the intrinsic layer 1221.

For example, the intrinsic layer 1221 is made of amorphous silicon (a-Si). The N-type doped layer 1222 is made of N+a-Si (i.e., a-Si doped with pentavalent ions such as phosphorus (P)), and the P-type doped layer 1223 is made of P+a-Si (i.e., a-Si doped with trivalent ions such as boron (B)).

In some examples, the first electrode 121 includes a metal element or a metal alloy. The metal element is, for example, copper, aluminum, or silver. The metal alloy is, for example, copper aluminum alloy.

In some examples, the second electrode 123 includes transparent conductive materials such as indium zinc oxide (IZO), indium tin oxide (ITO), aluminum zinc oxide (AZO), or indium fluorine oxide (IFO).

Figure 10:
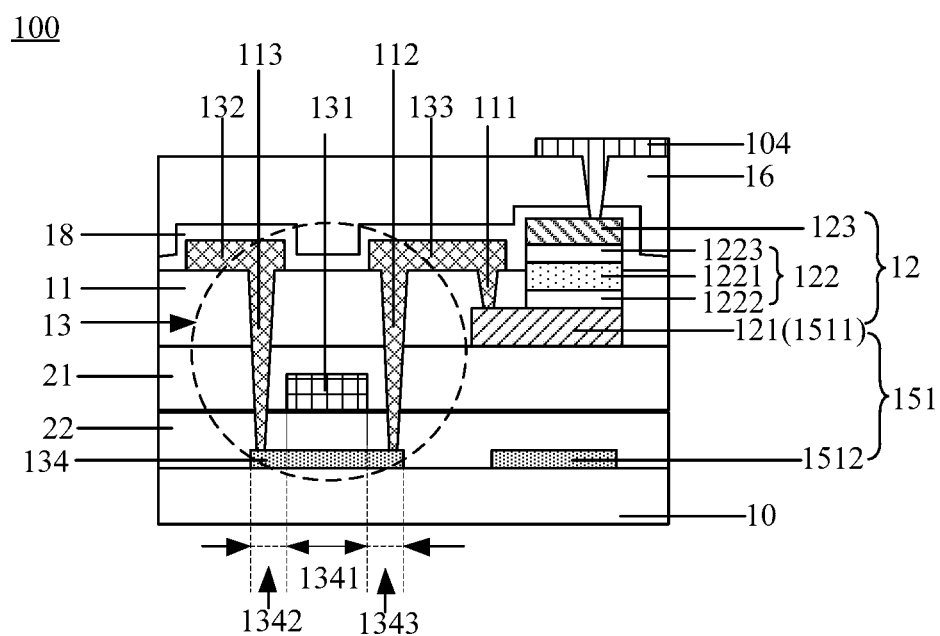
FIG. 10 is a schematic diagram showing a structure of yet another substrate, in accordance with some embodiments of the present disclosure.

In some examples, as shown in FIGS. 2 and 10, a part of the texture identification functional layer 122 is located in the via hole 110 in the thickness direction of the base 10. For example, as shown in FIG. 10, a part of the texture identification functional layer 122 is located in the via hole 110.

In some other examples, the entire texture identification functional layer 122 is located in the via hole 110 in the thickness direction of the base 10.

It can be understood that the thickness of a portion of the texture identification functional layer 122 located in the via hole 110 will be determined according to the total thickness of the first electrode 121 and the texture identification functional layer 122, and the depth of the via hole 110. In addition, the texture identifier 12 may be partially located in the via hole 110, or may be entirely located in the via hole 110.

For example, the texture identifier 12 is a photodiode.

Taking an example in which the object to be detected is a finger and the substrate 100 is applied to a display device, a process of identifying a fingerprint of the finger by means of the texture identifier 12 is described below. The fingerprint of the finger includes valleys and ridges. During the traveling of light toward the valleys, the light is totally reflected at an interface between a light exiting surface of the display device and air. After light is irradiated onto the ridges, the light is not totally reflected at the interface between the light exiting surface of the display device and the finger. Since an intensity of light reflected at the valleys is different from an intensity of light reflected by the ridges, intensities of the light received by the texture identifier 12 are also different. The texture identifier 12 outputs an electrical signal after receiving the light reflected at the valleys or the ridges. A magnitude of a parameter (e.g., a voltage or a current) of the electrical signal is related to the intensity of the light received by the texture identifier 12. The electrically signal is then transmitted to a signal processor (e.g., a signal processing chip), so that the signal processor may obtain a first texture image according to the electrical signal, and compare the first texture image with a pre-stored second texture image. For example, the signal processor determines whether the first texture image and the second texture image are fingerprints of a same finger or fingerprints of different fingers according to similarity between the first texture image and the second texture image, so as to achieve a purpose of texture identification.

It will be noted that, a structure of the texture identifier 12 includes, but is not limited to, the structure in the above examples, as long as the texture identifier 12 may convert an optical signal into an electrical signal.

With regard to the above description of the substrate 100, in a first possible embodiment, the substrate 100 is a substrate of a display panel in the display device.

Figure 5A:
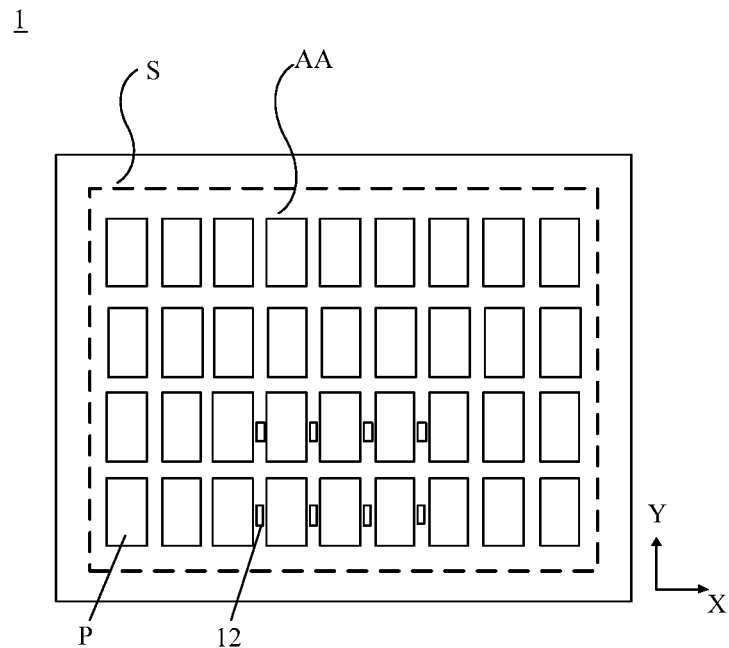
FIG. 5A is a schematic diagram showing a structure of a display panel, in accordance with some embodiments of the present disclosure.
Figure 5B:
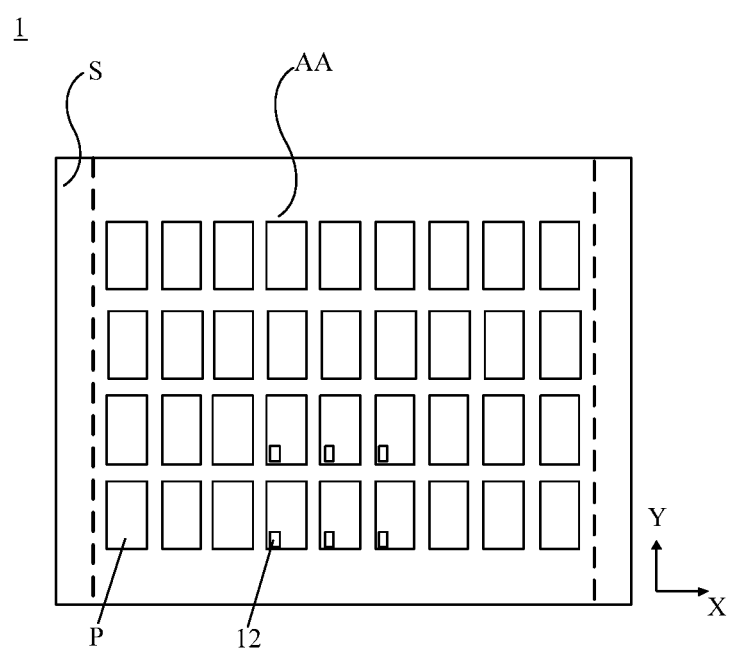
FIG. 5B is a schematic diagram showing a structure of another display panel, in accordance with some embodiments of the present disclosure.

As shown in FIGS. 5A and 5B, the display panel 1 has an active area AA and a peripheral region S located on a periphery of the active area AA. The active area AA includes a plurality of sub-pixel regions P. According to different designs of the display panel 1, a specific position of the peripheral region S may be changed accordingly. For example, as shown in FIG. 5A, the peripheral region S is disposed around the active area AA. For another example, the peripheral region S is located on one side of the active area AA. For yet another example, as shown in FIG. 5B, the peripheral region S is located on two opposite sides of the active area AA.

In some examples, the display panel 1 is a liquid crystal display panel, and the substrate 100 is an array substrate of the liquid crystal display panel.

Figure 6:
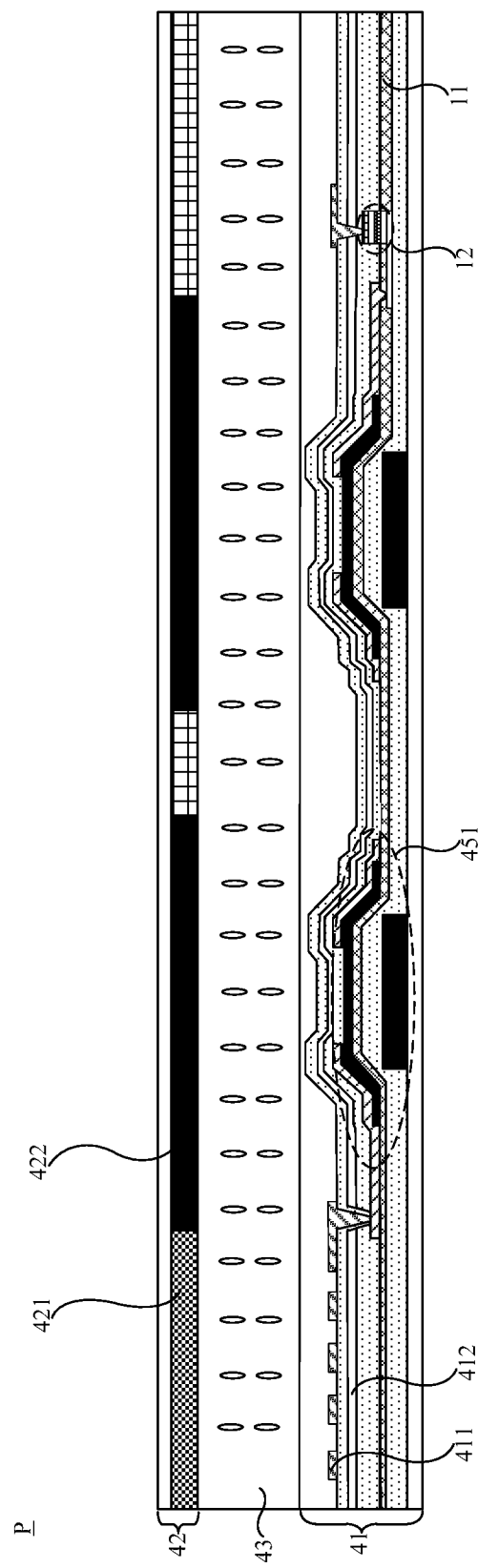
FIG. 6 is a schematic diagram showing a structure of a liquid crystal display panel, in accordance with some embodiments of the present disclosure.

For example, as shown in FIG. 6, the liquid crystal display panel includes the array substrate 41, an opposite substrate 42, and a liquid crystal layer 43 between the array substrate 41 and the opposite substrate 42. In addition to the first insulating layer 11 and the plurality of texture identifiers 12, the array substrate 41 further includes a plurality of thin film transistors (abbreviated as TFTs) 451 and a plurality of pixel electrodes 411 that are disposed on the base 10. Each thin film transistor 451 is connected to a corresponding pixel electrode 411, and the thin film transistor 451 and the corresponding pixel electrode 411 are both located in a sub-pixel region P.

The opposite substrate 42 includes a base substrate and a color filter layer 421 disposed on the base substrate. In this case, the opposite substrate 42 may also be referred to as a color filter (abbreviated as CF) substrate. The color filter layer 421 at least includes a first color photoresist unit, a second color photoresist unit and a third color photoresist unit. The first color photoresist unit, the second color photoresist unit and the third color photoresist unit are each disposed in a sub-pixel region. The first color, the second color and the third color are three primary colors (e.g., red, green and blue, respectively).

In addition, the opposite substrate 42 further includes a black matrix 422 disposed on the base substrate. The black matrix 422 is used for separating red color photoresist units, green color photoresist units and blue color photoresist units.

As shown in FIG. 6, the liquid crystal display panel further includes a common electrode 412. The common electrode 412 is disposed in the array substrate 41. Or, the common electrode 412 is disposed in the opposite substrate 42.

In some other examples, the display panel 1 is a self-luminescent display panel, and the substrate 100 is an array substrate in the self-luminescent display panel.

The self-luminescent display panel is, for example, an organic light-emitting diode (abbreviated as OLED) display panel, a micro light-emitting diode (abbreviated as Micro-LED) display panel, or a quantum dot light-emitting diode (abbreviated as QLED) display panel. The above are merely examples, and a type of the self-luminescent display panel is not limited thereto.

Figure 7:
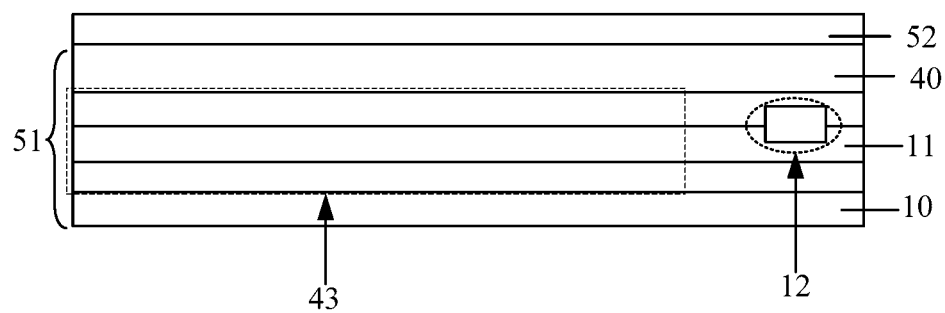
FIG. 7 is a schematic diagram showing a structure of a self-luminescent display panel, in accordance with some embodiments of the present disclosure.

Taking an example in which the self-luminescent display panel is the OLED display panel, as shown in FIG. 7, the OLED display panel includes an array substrate 51 and an encapsulating substrate 52. The encapsulating substrate 52 is a flexible film. Or, the encapsulating substrate 52 is a rigid substrate, such as a glass substrate.

As shown in FIG. 7, in addition to the first insulating layer 11 and the plurality of texture identifiers 12, the array substrate 51 further includes a plurality of pixel driver circuits 43 and a plurality of light-emitting devices 40 that are disposed on the base 10. Each light-emitting device 40 is connected to a corresponding pixel driver circuit 43, and the light-emitting device 40 and the corresponding pixel driver circuit 43 are both located in a sub-pixel region P. The encapsulating substrate 52 is disposed on a side of the light-emitting devices 40 away from the base 10.

In a second possible embodiment, the substrate 100 is disposed on a side of the display panel 1 in the display device in a thickness direction of the display panel 1. For example, the substrate 100 is bonded to the display panel 1 through an adhesive layer.

In the above two possible embodiments, the texture identifiers 12 are integrated into the display device. The display device includes, but is not limited to, any product or component having a display function, such as a cellphone, a tablet computer (PC), a personal digital assistance (PDA) or a vehicle-mounted computer.

In some embodiments, as shown in FIG. 5A, the texture identifier 12 is disposed in a region between two adjacent sub-pixel regions P in the active area AA. In some other embodiments, as shown in FIG. 5B, the texture identifier 12 is disposed in a sub-pixel region P.

Figure 8:
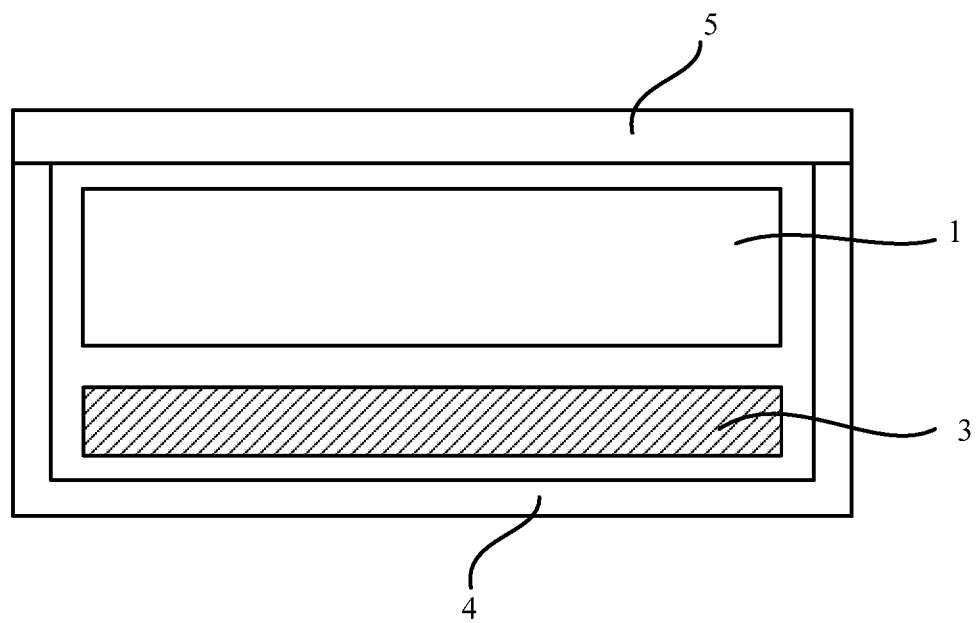
FIG. 8 is a schematic diagram showing a structure of a display device, in accordance with some embodiments of the present disclosure.

As shown in FIG. 8, the display device may further include a circuit board 3, a frame 4, a cover glass 5 and other electronic accessories. A cross section of the frame 4 is a U-shaped cross section. The display panel 1, the circuit board 3 and the other electronic accessories are disposed in a space sealed by the frame 4 and the cover glass 5. The circuit board 3 is disposed on a side of the display panel 1 away from a light exiting surface of the display panel 1. The cover glass 5 is disposed on a side of the light exiting surface of the display panel 1.

The circuit board 3 is configured to provide signals required for display to the display panel 1. For example, the circuit board 3 is a printed circuit board assembly (PCBA), which includes a printed circuit board (PCB), and a timing controller (TCON), a power management integrated circuit (PMIC) and other ICs or circuits that are disposed on the PCB.

In a third possible embodiment, the substrate 100 is used in a device other than the display device, such as a fingerprint attendance machine or a fingerprint lock. For example, in the case where the plurality of via holes 110 in the first insulating layer 11 of the substrate 100 are blind holes, the texture identifiers 12 in the via hole 110 may be electrically connected to a processor through a lead below the first electrode 121, thereby realizing the detection of the texture information.

Figure 9:
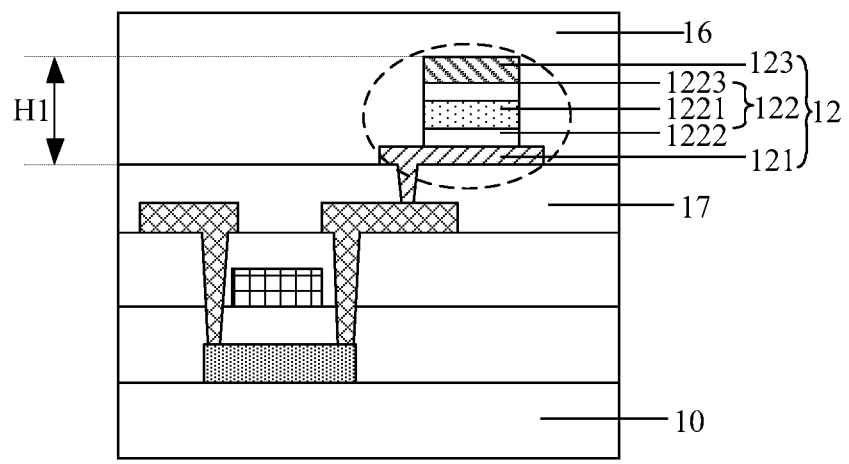
FIG. 9 is a schematic diagram showing a structure of a substrate in the related art.

FIG. 9 shows a substrate for texture identification in the related art. The substrate includes a base 10, a passivation layer 17 disposed on the base 10 and a plurality of texture identifiers 12 disposed on a surface of the passivation layer 17 away from the base 10 (FIG. 9 shows only one of the plurality of texture identifiers 12). The surface of the passivation layer 17 away from the base 10 is flat. There is a first height difference H1 between a surface of the texture identifier 12 away from the base 10 and the surface of the passivation layer 17 away from the base 10. The first height difference H1 is equal to a thickness of the texture identifier 12.

In this way, on one hand, since the first height difference H1 is large, a thickness of the substrate is large, and further stress generated in the substrate is large, so that the substrate is easy to deform. On the other hand, since the first height difference H1 is large, in a case where a planarization layer 16 is provided to counteract the effect of the first height difference H1, a thickness of the planarization layer 16 is greater than the first height difference H1 (the thickness of the planarization layer 16 is within a range from 2 µm to 3 µm), which may further cause an increase in the thickness of the substrate and an increase in the stress generated in the substrate.

In the substrate 100 provided by some embodiments of the present disclosure, the plurality of via holes 110 are disposed in the first insulating layer 11 of the substrate 100, and at least a part of the texture identifier 12 is disposed in the via hole 110. In this way, as shown in FIG. 1, in the substrate 100, a second height difference H2 between the surface of the texture identifier 12 away from the base 10 and the surface of the first insulating layer 11 away from the base 10 is less than the thickness of the texture identifier 12, so that the thickness of the substrate 100 may be reduced, and the stress generated in the substrate 100 may be reduced accordingly. Moreover, since the second height difference H2 is small, in a case where the planarization layer 16 is provided to counteract the effect of the second height difference H2, the thickness of the planarization layer 16 may also be reduced, thereby improving a problem of deformation of the substrate caused by an excessively large stress due to a stack of the texture identifier 12 and the first insulating layer 11.

In some embodiments, with reference to FIGS. 10 to 13, the substrate 100 further includes a plurality of first thin film transistors 13 disposed on the base 10. The first thin film transistor 13 is electrically connected to at least one texture identifier 12. In this case, the plurality of via holes 110 penetrate the first insulating layer 11, the first electrode 121 of the texture identifier 12 is disposed on a side of the first insulating layer 11 proximate to the base 10, and the texture identification functional layer 122 and the second electrode 123 are located in the via hole 110. In the thickness direction of the base 10, an area of an orthographic projection of the first electrode 121 on the base 10 is greater than an area of an orthographic projection of the second electrode 123 on the base 10.

As shown in FIGS. 10 to 13, at least one first thin film transistor 13 includes a first gate 131, a first source 132, a first drain 133, a first active pattern 134, and a portion of the first insulating layer 11 located in the first thin film transistor 13. The first source 132 and the first drain 133 are both in contact with the first active pattern 134. For example, each first thin film transistor 13 includes the first gate 131, the first source 132, the first drain 133, the first active pattern 134, and a portion of the first insulating layer 11 located in the first thin film transistor 13.

One of the first source 131 and the first drain 132 of the first thin film transistor 13 is electrically connected to at least one corresponding texture identifier 12.

The first thin film transistor 13 is used as a switch. For example, another of the first source 131 and the first drain 132 of the first thin film transistor 13 is connected to a signal reading line, so that after the first thin film transistor 13 is turned on, an electrical signal from the texture identifier 12 is transmitted to the signal reading line.

In some examples, as shown in FIGS. 10 to 13, the first insulating layer 11 is disposed between the first electrode 121 and a layer including the first source 132 and the first drain 133, and the first insulating layer 11 is in contact with both the first source 132 and the first drain 133. The first insulating layer 11 is used as an interlayer insulating layer.

The first insulating layer 11 has a plurality of first through holes 111. One of the first source 132 and the first drain 133 of the first thin film transistor 13 is electrically connected to a corresponding texture identifier 12 through a corresponding first through hole 111.

For example, as shown in FIGS. 10 to 13, the first drain 133 of the first thin film transistor 13 is closer to the texture identifier 12 than the first source 132 in a direction parallel to the base 10. The first drain 133 of the first thin film transistor 13 is electrically connected to the first electrode 121 of the texture identifier 12 through a first through hole 111.

For another example, the first source 132 is closer to the texture identifier 12 than the first drain 133 in the direction parallel to the base 10. The first source 132 of the first thin film transistor 13 is electrically connected to the first electrode 121 of the texture identifier 12 through a first through hole 111.

In some examples, as shown in FIGS. 10 to 13, a plurality of insulating layers are provided between the first active pattern 134 and a layer including the first source 132 and the first drain 133. The plurality of insulating layers include at least the first insulating layer 11 and a first gate insulating layer 21 disposed on a side of the first insulating layer 11 proximate to the first active pattern 134. The first drain 133 is in contact with the first active pattern 134 through a second through hole 112 penetrating the plurality of insulating layers. The first source 132 is in contact with the first active pattern 134 through a third through hole 113 penetrating the plurality of insulating layers. The second through hole 112 and the third through hole 113 each include a plurality of sub-through holes stacked in the thickness direction of the base 10. Any two adjacent sub-through holes are connected, and each sub-through hole passes through a corresponding one of the plurality of insulating layers.

The first thin film transistor 13 may be a top-gate thin film transistor or a bottom-gate thin film transistor.

Figure 11:
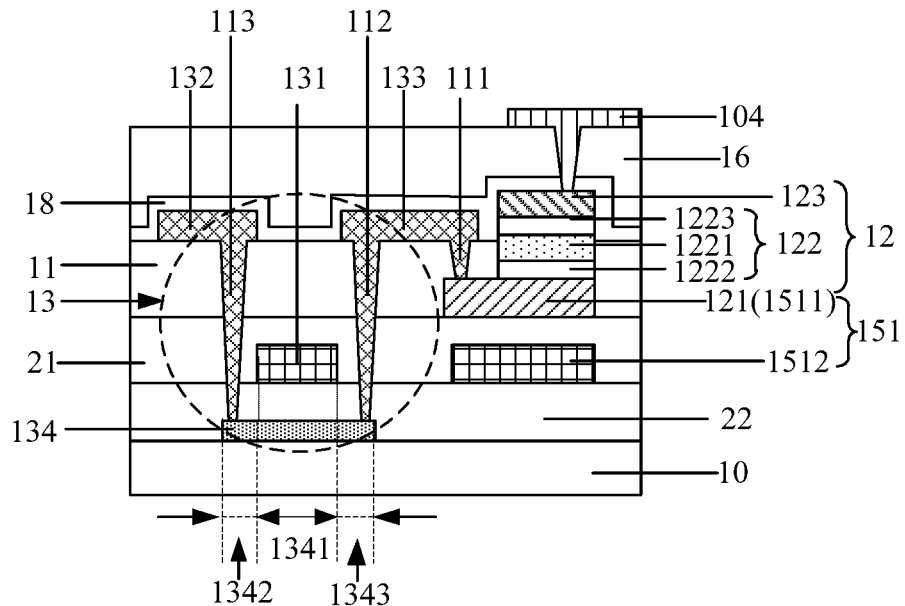
FIG. 11 is a schematic diagram showing a structure of yet another substrate, in accordance with some embodiments of the present disclosure.

In some examples, with reference to FIGS. 10 and 11, the first thin film transistor 13 is a top-gate thin film transistor. That is, the first gate 131 of the first thin film transistor is disposed on a side of the first active pattern 134 away from the base 10. In this case, the plurality of insulating layers include the first insulating layer 11, the first gate insulating layer 21 between the first insulating layer 11 and the first gate 131, and a second gate insulating layer 22 between the first gate 131 and the first active pattern 134.

As shown in FIGS. 10 and 11, the first active pattern 134 has a first channel region 1341, and a first source region 1342 and a first drain region 1343 that are located on two opposite sides of the first channel region 1341. The first active pattern 134 includes a portion located in the first channel region 1341, a portion located in the first source region 1342, and a portion located in the first drain region 1343.

An orthographic projection of the portion of the first active pattern 134 located in the first channel region 1341 on the base 10 overlaps with an orthographic projection of the first gate 131 on the base 10. An orthographic projection of the portion of the first active pattern 134 located in the first source region 1342 on the base 10 and an orthographic projection of the portion located in the first drain region 1343 on the base 10 do not overlap with the orthographic projection of the first gate 131 on the base 10.

The first source 132 is in contact with the portion of the first active pattern 134 located in the first source region 1342 through the third through hole 113. The first drain 133 is in contact with the portion of the first active pattern 134 located in the first drain region 1343 through the second through hole 112.

The portion of the first active pattern 134 located in the first channel region 1341 is made of a semiconductor material. The portions of the first active pattern 134 located in the first source region 1342 and in the first drain region 1343 include a semiconductor material and N-type ions or P-type ions. Thus, the portion of the first active pattern 134 located in the first source region 1342 and the portion of the first active pattern 134 located in the first drain region 1343 are conductors.

The process of forming the first active pattern 134 includes: forming a semiconductor film; performing a patterning process on the semiconductor film to obtain a first semiconductor pattern; and after the first gate 131 is formed, making a portion of the first semiconductor pattern that is not covered by the first gate 131 be conductive by taking the first gate 131 as a mask to obtain the first active pattern 134. A portion of the first active pattern 134 that is non-conductive is a portion corresponding to the first channel region 1341.

For example, the portion of the first active pattern 134 located in the first channel region 1341 includes one of metal oxide semiconductor materials such as indium gallium zinc oxide (abbreviated as IGZO) and indium tin oxide zinc (abbreviated as ITZO). For another example, the portion of the first active pattern 134 located in the first channel region 1341 includes polysilicon (p-Si), which may be obtained after crystallization of amorphous silicon (a-Si). The semiconductor materials listed above are merely examples, and the embodiments of the present disclosure include, but are not limited to, the semiconductor materials listed above.

Figure 12:
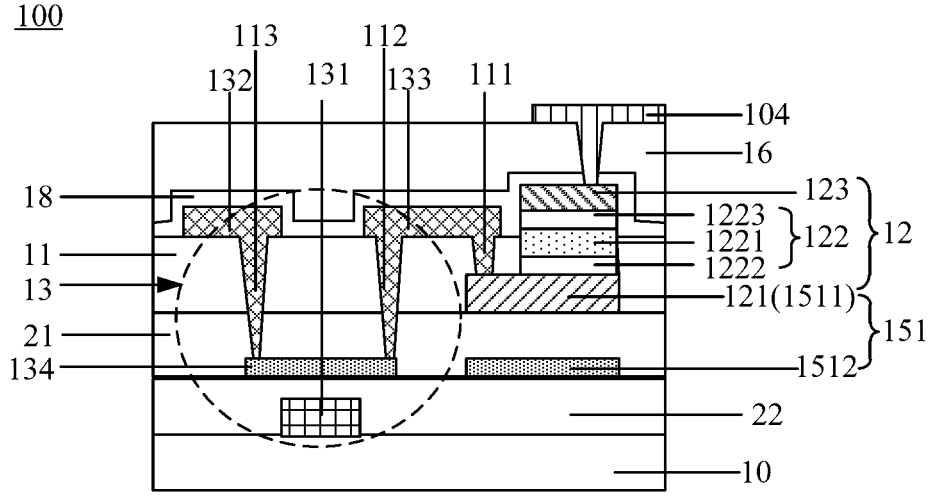
FIG. 12 is a schematic diagram showing a structure of yet another substrate, in accordance with some embodiments of the present disclosure.
Figure 13:
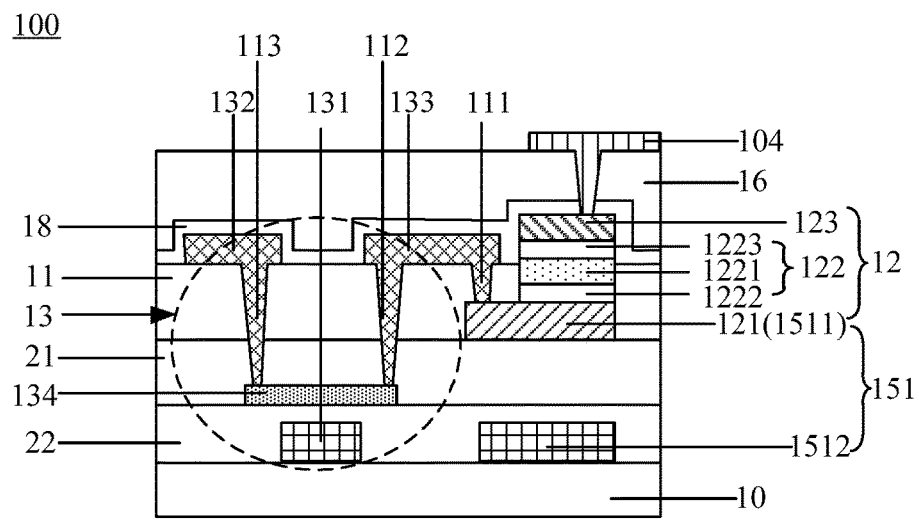
FIG. 13 is a schematic diagram showing a structure of yet another substrate, in accordance with some embodiments of the present disclosure.

In some other examples, with reference to FIGS. 12 and 13, the first thin film transistor 13 is a bottom-gate thin film transistor. That is, the first gate 131 of the first thin film transistor 13 is disposed on a side of the first active pattern 134 proximate to the base 10. In this case, the plurality of insulating layers include the first insulating layer 11, and the first gate insulating layer 21 between the first insulating layer 11 and the first active pattern 134.

As shown in FIGS. 12 and 13, the first active pattern 134 may only include a semiconductor material. Alternatively, the first active pattern 134 may have the first channel region 1341, and a first source region 1342 and a first drain region 1343 that are located on both sides of the first channel region 1341. That is, the first active pattern 134 includes the portion located in the first channel region 1341, the portion located in the first source region 1342, and the portion located in the first drain region 1343.

In the embodiments of the present disclosure, that the active pattern of the top-gate thin film transistor includes a channel region made of a semiconductor material, and a source region and a drain region that are made of a conductive material, and the active pattern of the bottom-gate thin film transistor is made of a semiconductor material is taken as examples for description.

It will be noted that, in order to show the structure of the first thin film transistor 13 clearly, only one first thin film transistor 13 is shown in FIGS. 10 to 13. In the substrate 100 provided by some embodiments of the present disclosure, a structure of the first thin film transistor 13 is the same as that of the first thin film transistor 13 in the above examples. As for details, reference may be made to the above corresponding description about the first thin film transistor 13, which will not be repeated herein.

In some embodiments, as shown in FIGS. 10 to 13, the substrate 100 further includes a plurality of first storage capacitors 151. Each texture identifier 12 is connected to a respective one of the plurality of first storage capacitors 151. The texture identifier 12 is configured to sense light intensity information, and converts the light intensity information into an electrical signal. The first storage capacitor 151 is configured to store the electrical signal generated by the texture identifier 12.

As shown in FIGS. 10 to 13, the first storage capacitor 151 includes a first storage electrode 1511 and a second storage electrode 1512 arranged in the thickness direction of the base 10. The first storage electrode 1511 is disposed on a side of the second storage electrode 1512 away from the base 10. For example, each first storage capacitor 151 includes the first storage electrode 1511 and the second storage electrode 1512 arranged in the thickness direction of the base 10, and the first storage electrode 1511 is disposed on the side of the second storage electrode 1512 away from the base 10.

As shown in FIGS. 10 to 13, the first storage electrode 1511 is further used as a first electrode 121 of a corresponding texture identifier 12.

In this way, a connection between the first storage capacitor 151 and the texture identifier 12 may be achieved, and the thickness of the substrate 100 may be further reduced.

Of course, it can be understood that, the first storage electrode 1511 and the first electrode 121 of the texture identifier 12 may also be separately provided. In this case, the first storage electrode 1511 is electrically connected to the first electrode 121.

As for an arrangement of the second storage electrode 1512, there are two possible implementations.

In one possible implementation, as shown in FIGS. 11 and 13, the second storage electrode 1512 is disposed in a same layer as the first gate 131 of the first thin film transistor 13.

In this case, the second storage electrode 1512 is made of the same material as the first gate 131. For example, the second storage electrode 1512 and the first gate 131 are both made of a metal material such as copper, aluminum, or silver.

In some examples, as shown in FIG. 13, the first gate 131 is disposed on a side of the first active pattern 134 proximate to the substrate 10 (i.e., the first thin film transistor 13 is a bottom-gate thin film transistor). In this case, a layer in which the second storage electrode 1512 and the first gate 131 are located is disposed on the side of the first active pattern 134 proximate to the substrate 10.

In some other examples, as shown in FIG. 11, the first gate 131 is disposed on a side of the first active pattern 134 away from the substrate 10 (i.e., the first thin film transistor 13 is a top-gate thin film transistor). In this case, the layer in which the second storage electrode 1512 and the first gate 131 are located is disposed on the side of the first active pattern 134 away from the substrate 10.

In another possible implementation, as shown in FIGS. 10 and 12, the second storage electrode 1512 is disposed in a same layer as the first active pattern 134 of the first thin film transistor 13. The second storage electrode 1512, the portion of the first active pattern 134 located in the first source region 1342, and the portion of the first active pattern 134 located in the first drain region 1343 are made of a same material. For example, the second storage electrode 1512, the portions of the first active pattern 134 located in the first source region 1342 and in the first drain region 1343 are all made of a semiconductor material doped with ions such as indium gallium zinc oxide (IGZO) doped with ions, Indium tin oxide zinc (ITZO) doped with ions, or p-Si doped with ions.

The process of forming the first active pattern 134 and the second storage electrode 1512 includes: forming the semiconductor film; performing a patterning process on the semiconductor film to obtain a first semiconductor pattern and a first transition pattern; after the first gate 131 is formed, making the portion of the first semiconductor pattern that is not covered by the first gate 131 being conductive by taking the first gate 131 as a mask to obtain the first active pattern 134; and making a first transition pattern being conductive to obtain the second storage electrode 1512. The portion of the first active pattern 134 that is non-conductive is the portion in the first channel region 1341.

In some examples, as shown in FIG. 12, the first gate 131 is disposed on a side of the first active pattern 134 proximate to the base 10 (i.e., the first thin film transistor 13 is a bottom-gate thin film transistor). In this case, a layer in which the second storage electrode 1512 and the first active pattern 134 are located is disposed on the side of the first gate 131 away from the base 10.

In some other examples, as shown in FIG. 10, the first gate 131 is disposed on a side of the first active pattern 134 away from the base 10 (i.e., the first thin film transistor 13 is a top-gate thin film transistor). In this case, the layer in which the second storage electrode 1512 and the first active pattern 134 are located is disposed on the side of the first gate 131 proximate to the base 10.

In some embodiments, in a case where the substrate 100 is applied to the display device, as shown in FIGS. 14 to 17, the substrate 100 further includes a plurality of pixel driver circuits disposed on the base 10. The pixel driver circuit includes at least one second thin film transistor 14. For example, each pixel driver circuit includes at least one second thin film transistor 14.

As shown in FIGS. 14 to 17, the second thin film transistor 14 includes a second gate 141, a second source 142, a second drain 143, a second active pattern 144, and a portion of the first insulating layer 11 located in the second thin film transistor 14.

The second gate 141 is disposed in a same layer as the first gate 131. The second active pattern 144 is disposed in a same layer as the first active pattern 134. The second source 142, the second drain 143, the first source 132 and the first drain 133 are disposed in a same layer. The second drain 143 is in contact with the second active pattern 144 through a fourth through hole 114 penetrating the plurality of insulating layers. The second source 142 is in contact with the second active pattern 144 through a fifth through hole 115 penetrating the plurality of insulating layers.

In this way, the first thin film transistor 13 and the second thin film transistor 14 may be simultaneously formed.

That is to say, in a case where the first thin film transistor 13 is the top-gate thin film transistor, the second thin film transistor 14 is the top-gate thin film transistor. In a case where the first thin film transistor 13 is the bottom-gate thin film transistor, the second thin film transistor 14 is the bottom-gate thin film transistor.

Figure 14:
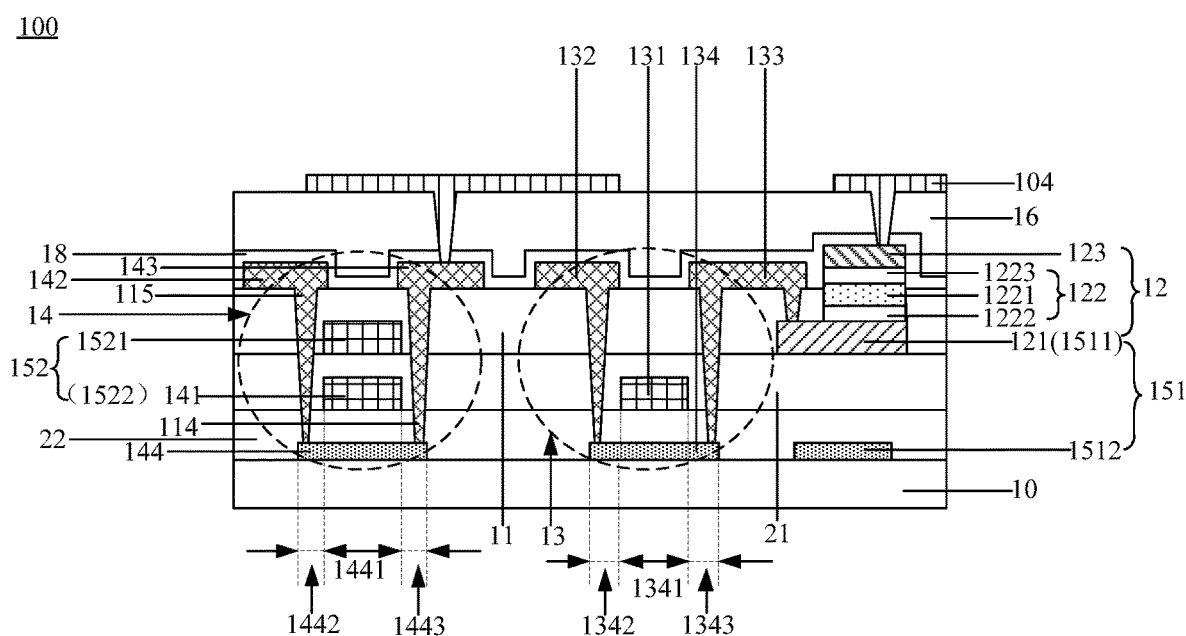
FIG. 14 is a schematic diagram showing a structure of yet another substrate, in accordance with some embodiments of the present disclosure.
Figure 15:
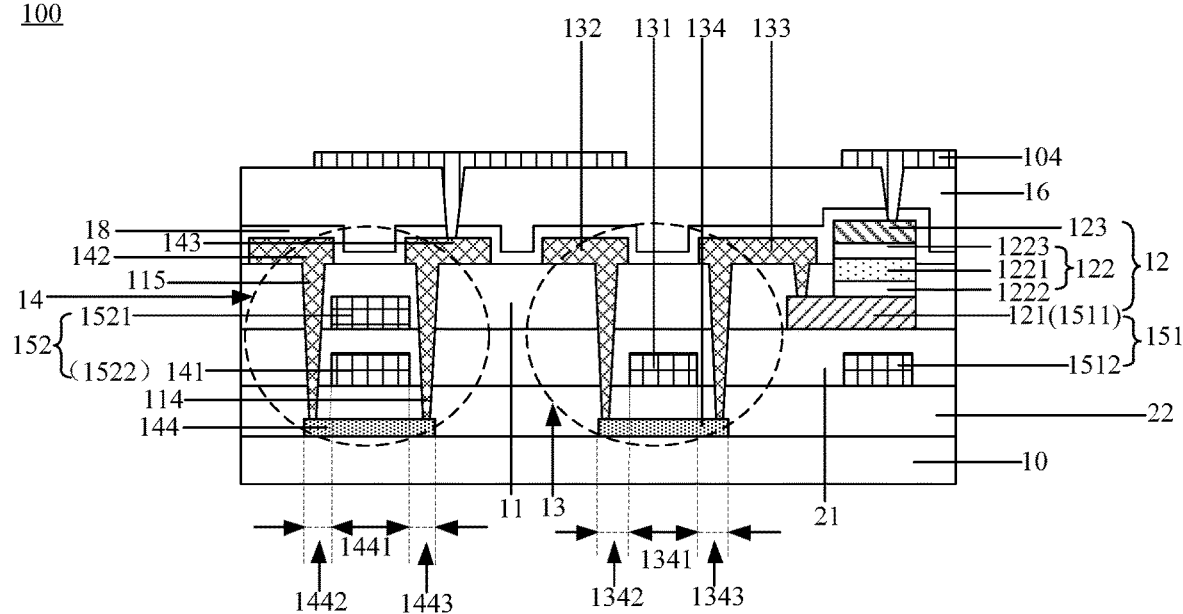
FIG. 15 is a schematic diagram showing a structure of yet another substrate, in accordance with some embodiments of the present disclosure.

In some examples, with reference to FIGS. 14 and 15, the second thin film transistor 14 is a top-gate thin film transistor. In this case, the second active pattern 144 has a second channel region 1441, and a second source region 1442 and a second drain region 1443 that are located on two opposite sides of the second channel region 1441. The second active pattern 144 includes a portion located in the second channel region 1441, a portion located in the second source region 1442, and a portion located in the second drain region 1443. The second source 142 is in contact with the portion of the second active pattern 144 located in the second source region 1442. The second drain 143 is in contact with the portion of the second active pattern 144 located in the second drain region 1443.

Similar to the first active pattern 134, an orthographic projection of the portion of the second active pattern 144 located in the second channel region 1441 on the base 10 overlaps with an orthographic projection of the second gate 141 on the base 10. An orthographic projection of the portion of the second active pattern 144 located in the second source region 1442 on the base 10 and an orthographic projection of the portion of the second active pattern 144 located in the second drain region 1443 on the base 10 do not overlap with the orthographic projection of the second gate 141 on the base 10.

Figure 16:
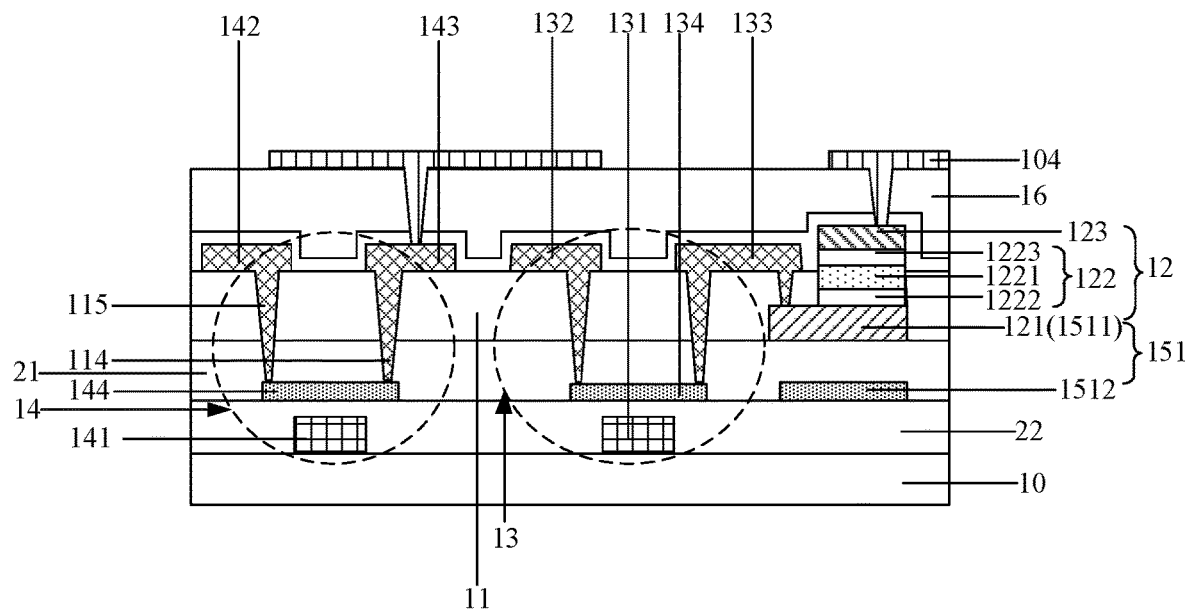
FIG. 16 is a schematic diagram showing a structure of yet another substrate, in accordance with some embodiments of the present disclosure.

In a case where the second storage electrode 1512 is disposed in the same layer as the first active pattern 134, as shown in FIGS. 14 and 16, the second storage electrode 1512, the first active pattern 134 and the second active pattern 144 are disposed in the same layer. The second storage electrode 1512, the portions of the first active pattern 134 located in the first source region 1342 and in the first drain region 1343, and the portions of the second active pattern 144 located in the second source region 1442 and in the second drain region 1443 are made of the same material.

Figure 17:
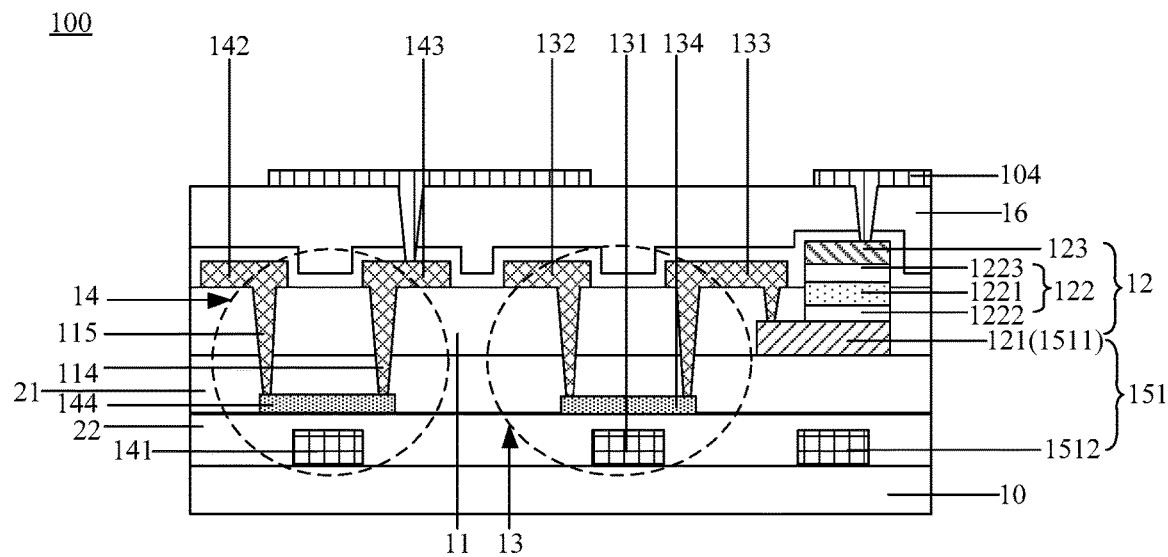
FIG. 17 is a schematic diagram showing a structure of yet another substrate, in accordance with some embodiments of the present disclosure.

In a case where the second storage electrode 1512 is disposed in the same layer as the first gate 131, as shown in FIGS. 15 and 17, the second storage electrode 1512, the first gate 131 and the second gate 141 are disposed in the same layer. The second storage electrode 1512, the first gate 131 and the second gate 141 are made of the same material.

In some other examples, as shown in FIGS. 16 and 17, the second thin film transistor 14 is a bottom-gate thin film transistor. For example, as shown in FIGS. 16 and 17, the second active pattern 144 may only include a semiconductor material. Alternatively, the second active pattern 144 may have the second channel region 1441, and the second source region 1442 and the second drain region 1443 that are located on two opposite sides of the second channel region 1441. That is, the second active pattern 144 includes the portion located in the second channel region 1441, the portion located in the second source region 1442, and the portion located in the second drain region 1443.

It will be understood that structures and materials of parts of the second thin film transistor 14 can be the same as structures and materials of parts of the first thin film transistor 13, respectively.

It will be noted that, in order to show the structure of the second thin film transistor 14 clearly, only one second thin film transistor 14 is shown in FIGS. 14 to 17. A structure of each second thin film transistor 14 is the same as that of the second thin film transistor 14 in the above examples. As for details, reference may be made to the corresponding description about the second thin film transistor 14 in the above embodiments, which will not be repeated herein.

In some embodiments, as shown in FIGS. 14 and 15, the pixel driver circuit further includes a second storage capacitor 152. The second storage capacitor 152 includes a third storage electrode 1521 and a fourth storage electrode 1522 that are arranged in the thickness direction of the base 10. The second thin film transistor 14 is a driving transistor, and the fourth storage electrode 1522 is further used as the second gate 141.

In some examples, the second gate 141 is disposed on a side of the second active pattern 144 away from the base 10.

The third storage electrode 1521 is disposed on a side of the fourth storage electrode 1522 away from the base 10. For example, the third storage electrode 1521 is disposed in a same layer as the first electrode 121. In this way, a process for manufacturing the substrate 100 may be simplified.

In some examples, as shown in FIGS. 14 and 15, the third storage electrode 1521 is disposed on a surface of the first insulating layer 11 proximate to the base 10. The first gate insulating layer 21 is disposed between the third storage electrode 1521 and the fourth storage electrode 1522 (i.e., the second gate 141).

Figure 18:
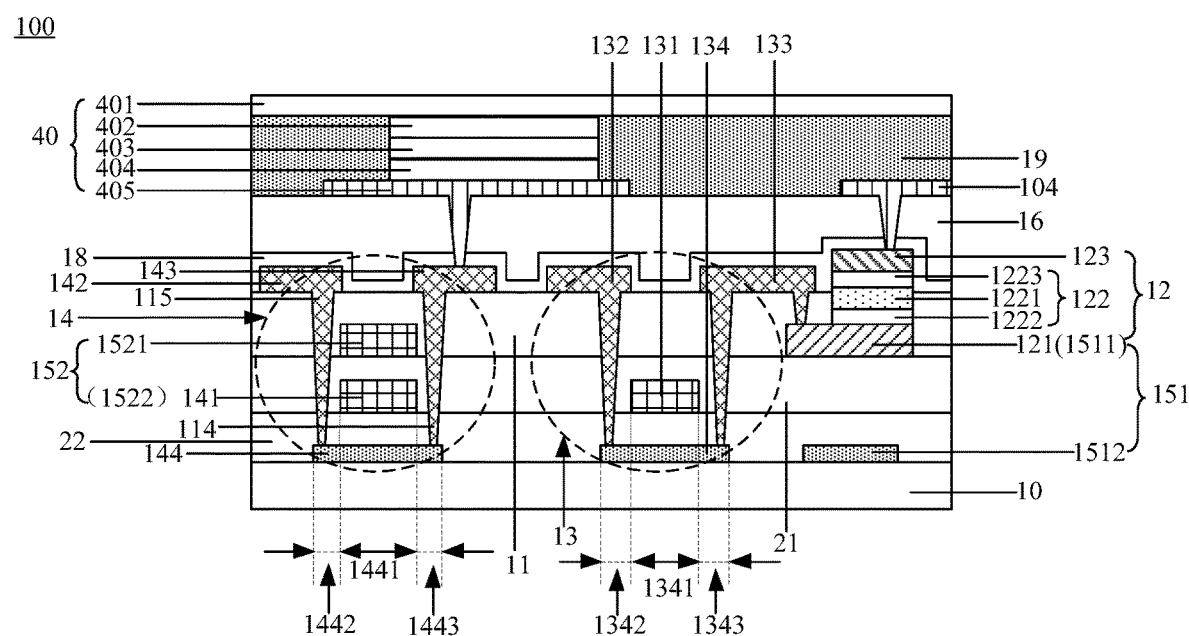
FIG. 18 is a schematic diagram showing a structure of yet another substrate, in accordance with some embodiments of the present disclosure.

In the case where the substrate 100 is applied to the display device, in some embodiments, as shown in FIG. 18, the substrate 100 further includes a plurality of light-emitting devices 40 disposed on a side of the plurality of pixel driver circuits away from the base 10. Each light-emitting device 40 is electrically connected to a corresponding pixel driver circuit.

In some examples, as shown in FIG. 18, the light-emitting device 40 includes a cathode 401, an anode 405, and a light-emitting functional layer between the cathode 401 and the anode 405. The anode 405 of the light-emitting device 40 is electrically connected to the corresponding pixel driver circuit.

Taking an example in which the light-emitting device is an OLED, as shown in FIG. 18, the light-emitting functional layer includes an organic light-emitting layer 403, a hole transport layer 404 between the organic light-emitting layer 403 and the anode 405, and an electron transport layer 402 between the organic light-emitting layer 403 and the cathode 401.

In some examples, the light-emitting functional layer further includes at least one of a hole injection layer disposed between the hole transport layer 404 and the anode 405 and an electron injection layer disposed between the electron transport layer 402 and the cathode 401.

In some embodiments, as shown in FIG. 18, the substrate 100 further includes a pixel defining layer 19 disposed on a side of the plurality of pixel driver circuits away from the base 10. The pixel defining layer 19 includes a plurality of openings. Each opening is configured to define a light-emitting region. The light-emitting functional layer of the light-emitting device 40 is disposed in the opening. The anode 405 is disposed between the pixel defining layer 19 and the pixel driver circuit.

It will be noted that, in order to show the structure of the light-emitting device 40 clearly, FIG. 18 shows only one light-emitting device 40.

In some examples, as shown in FIG. 18, the substrate 100 further includes first conductive patterns 104 disposed in a same layer as the anode 405. The second electrode 123 of the texture identifier 12 is electrically connected to a corresponding first conductive pattern 104.

In some embodiments, as shown in FIGS. 10 to 18, the substrate 100 further includes the planarization layer 16 disposed on a side of the texture identifier 12 away from the base 10. In the thickness direction of the base 10, the thickness of the planarization layer 16 is within a range of 1.2 μm to 1.8 μm. For example, the thickness of the planarization layer 16 may be 1.2 μm, 1.5 μm, 1.7 μm, or 1.8 μm.

In some examples, the planarization layer 16 includes an organic insulating material. For example, the planarization layer 16 is made of resin.

There is a step between the surface of the texture identifier 12 away from the base 10 and the surface of the first insulating layer 11 away from the base 10 in the thickness direction of the base 10. The space around the step may be filled by the planarization layer 16, and thus a surface of the substrate 100 may be flat. Moreover, in the embodiments of the present disclosure, since the via holes are formed in the first insulating layer 11 and at least a part of the texture identifier 12 is located in a corresponding via hole, the thickness of the planarization layer 16 may be controlled within the range of 1.2 μm to 1.8 μm. In this way, on one hand, in the case where the substrate 100 is applied to the display device, it is advantageous for a thin design of the display device. On the other hand, in a case where the planarization layer 16 is made of photosensitive resin and the planarization layer 16 further includes at least one via hole, a degree of exposure at a position of a via hole in the planarization layer 16 may be increased.

In some embodiments, as shown in FIGS. 10 to 18, the substrate 100 further includes a protective layer 18 disposed on a surface of the planarization layer 16 proximate to the base 10.

In some examples, the protective layer 18 is made of an inorganic insulating material, and the planarization layer 16 is made of an organic insulating material. In this case, adhesiveness between structures on a side of the protective layer 18 proximate to the base 10 and the planarization layer 16 may be increased through the protective layer 18.

Figure 19:
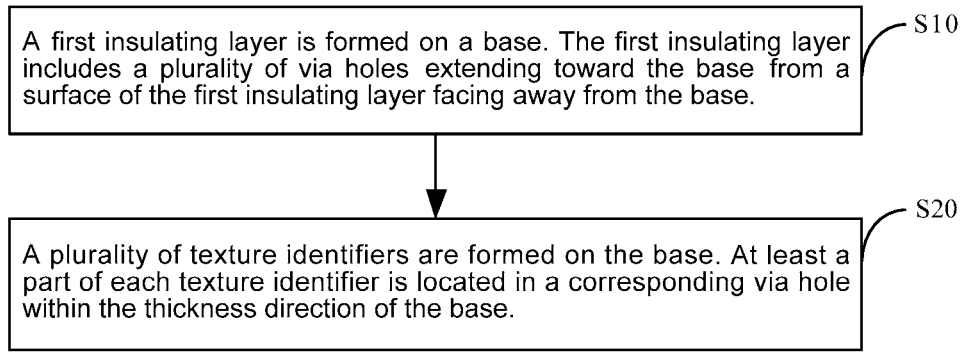
FIG. 19 is a flow diagram of a method for manufacturing a substrate, in accordance with some embodiments of the present disclosure.

Some embodiments of the present disclosure provide a method for manufacturing a substrate, such as the substrate 100 in any embodiment described above. As shown in FIG. 19, the method includes S10 to S20.

In S10, a first insulating layer 11 is formed on a base 10. The first insulating layer 11 includes a plurality of via holes 110 extending toward the base 10 from a surface of the first insulating layer 11 facing away from the base 10.

In this step, the base 10 may be cleaned first, and then the first insulating layer 11 is formed on the base 10.

In some examples, as shown in FIG. 3, the depth of the via hole 110 is less than a thickness of the first insulating layer 11 in a thickness direction of the base 10. That is, the via hole 110 is a blind hole (also called a groove).

In some other examples, as shown in FIG. 4, the depth of the via hole 110 is equal to the thickness of the first insulating layer 11 in the thickness direction of the base 10. That is, the via hole 100 is a through hole (also called an opening).

In S20, a plurality of texture identifiers 12 are formed on the base 10. At least a part of each texture identifier 12 is located in a corresponding via hole 110 within the thickness direction of the base 10.

In some examples, forming the texture identifier 12 includes: sequentially forming a first electrode 121, a texture identification functional layer 122 and a second electrode 123 in the thickness direction of the base 10.

As shown in FIG. 2, the texture identification functional layer 122 includes an intrinsic layer 1221, an N-type doped layer 1222 disposed between the first electrode 121 and the intrinsic layer 1221, and a P-type doped layer 1223 disposed between the second electrode 123 and the intrinsic layer 1221. In some examples, a part of the texture identification functional layer 122 is located in a corresponding via hole 110. In some other examples, the entire texture identification functional layer 122 is located in a corresponding via hole 110.

For example, a first insulating film is first formed on the base 10, and then a plurality of via holes 110 are formed in a surface of the first insulating film facing away from the base 10, and then a texture identifier 12 is formed in each via hole 110.

For another example, a first insulating film is first formed on the base 10, and then a plurality of via holes 110 which penetrate the first insulating film are formed in the first insulating film, and then a texture identifier 12 is formed in each via hole 110. In the thickness direction of the base 10, at least a part of the texture identifier 12 is located in the via hole 110.

For example, the plurality of texture identifiers are first formed on the base 10. Then a first insulating film is formed on the base 10 formed with the plurality of texture identifiers, and portions of the first insulating film corresponding to the texture identifiers 12 are etched to form via holes penetrating the first insulating film, so that at least a part of each texture identifier 12 is located in a corresponding via hole 110 in the first insulating layer 11 in the thickness direction of the base 10.

For another example, first electrodes 121 of the plurality of texture identifiers 12 are first formed on the base 10. Then a first insulating film is formed. A plurality of via holes 110 penetrating the first insulating film are formed in the first insulating film, and each via hole 110 exposes a corresponding first electrode 121. Afterwards, remaining structures of the texture identifier 12 are formed in each corresponding via hole 110.

It will be understood that the sequence of the S10 and the S20 may be determined according to a specific process, which is not limited herein.

In some embodiments, as shown in FIGS. 10 to 18, the method for manufacturing the substrate further includes: forming a plurality of first thin film transistors 13 on the base 10. One of a first source 132 and a first drain 133 in the first thin film transistor 13 is electrically connected to at least one corresponding texture identifier 12. As for a structure of the first thin film transistor 13, reference may be made to the corresponding description about the structure of the first thin film transistor 13 in the above embodiments, which will not be repeated herein.

In some embodiments, the first source 132 and the first drain 133 are formed directly after the first insulating layer 11 is formed. That is, the first insulating layer 11 is located on a side of the first source 132 and the first drain 133 that is proximate to the base 10, and the first insulating layer 11 is in contact with the first source 132 and the first drain 133. The first insulating layer 11 is used as an interlayer insulating layer.

On this basis, as shown in FIGS. 10 to 17, before the first insulating layer 11 is formed, the method for manufacturing the substrate further includes: forming a plurality of first storage capacitors 151. The first storage capacitor 151 includes a second storage electrode 1512 and a first storage electrode 1511 that are sequentially formed on the base 10 in the thickness direction of the base 10. The first storage electrode 1511 of the first storage capacitor 151 is further used as a first electrode 121 of a corresponding texture identifier 12.

Further, after the first insulating layer 11 is formed, forming the plurality of texture identifier 12 includes: forming texture identification functional layers 122 each on a corresponding first storage capacitor 151; and forming second electrodes 123 each on a corresponding texture identification functional layer 122.

In some embodiments, as shown in FIGS. 11, 13, 15 and 17, the second storage electrode 1512 is disposed in a same layer as a first gate 131.

On this basis, forming the second storage electrode 1512 and the first gate 131 includes: forming a metal film on the base 10, and performing a patterning process on the metal film to form the second storage electrode 1512 and the first gate 131.

In some other embodiments, as shown in FIGS. 10, 12, 14, 16 and 18, the second storage electrode 1512 is disposed in a same layer as a first active pattern 134.

Figure 20:
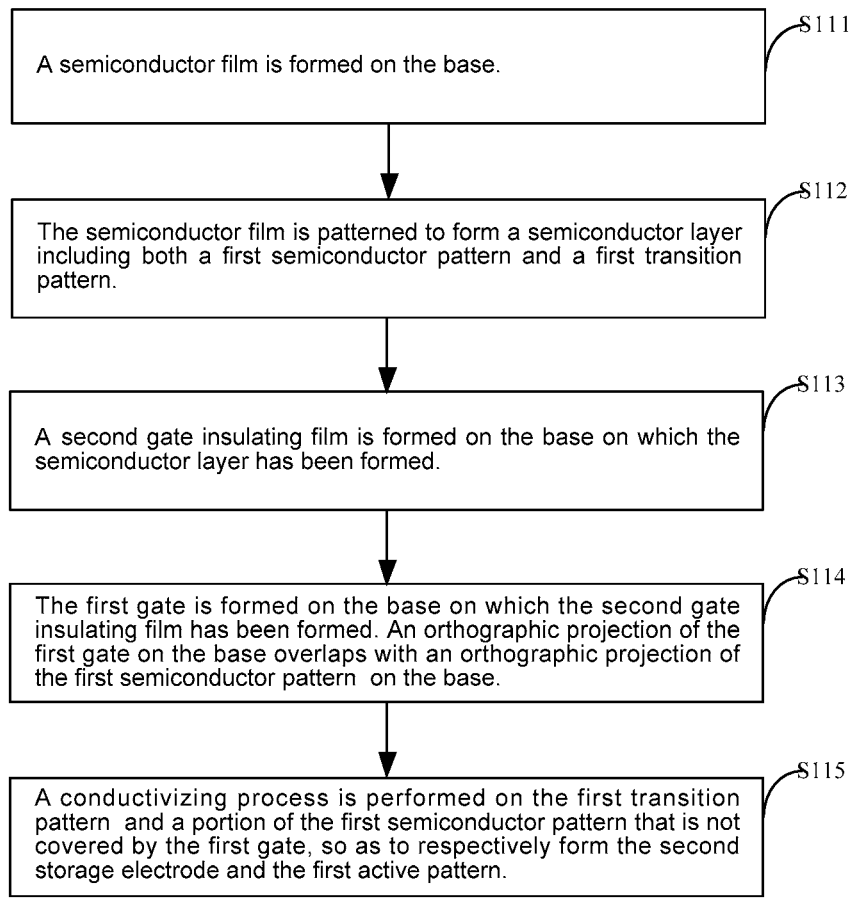
FIG. 20 is a flow diagram of a method for manufacturing another substrate, in accordance with some embodiments of the present disclosure.

On this basis, as shown in FIG. 20, forming the second storage electrode 1512, the first active pattern 134 and the first gate 131 includes S111 to S115.

Figure 21:
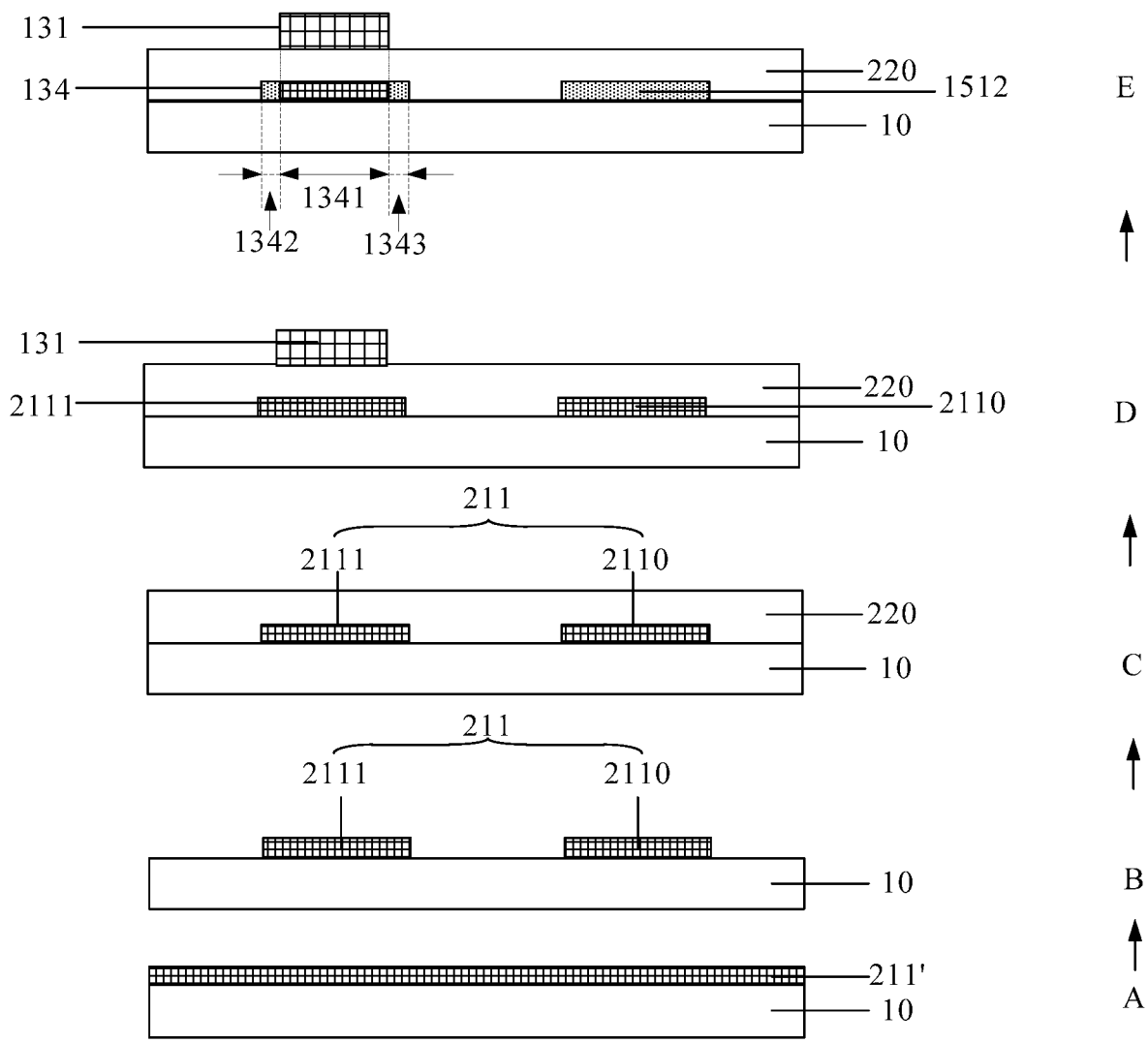
FIG. 21 is a schematic diagram showing structures in a process of manufacturing a substrate, in accordance with some embodiments of the present disclosure.

In S111, as shown in part A in FIG. 21, a semiconductor film 211' is formed on the base 10.

In S112, the semiconductor film 211' is patterned to form a semiconductor layer 211 including both a first semiconductor pattern 2111 and a first transition pattern 2110.

In this step, the process of patterning includes: forming a photoresist on the semiconductor film 211' first; exposing and developing the photoresist to obtain photoresist patterns; then, etching the semiconductor film 211' to obtain the semiconductor layer 211 shown in part B in FIG. 21; and then, removing the photoresist patterns.

It will be understood that, although the part B in FIG. 21 shows only one first semiconductor pattern 2111 and only one first transition pattern 2110, the semiconductor layer 211 formed by patterning the semiconductor film 211' actually includes a plurality of first semiconductor patterns 2111 and a plurality of first transition patterns 2110.

In S113, as shown in part C in FIG. 21, a second gate insulating film 220 is formed on the base 10 on which the semiconductor layer 211 has been formed.

In S114, the first gate 131 is formed on the base 10 on which the second gate insulating film 220 has been formed. An orthographic projection of the first gate 131 on the base 10 overlaps with an orthographic projection of the first semiconductor pattern 2111 on the base 10.

As shown in part D in FIG. 21, the first gate 131 is disposed on the second gate insulating film 220. The orthographic projection of the first gate 131 on the base 10 overlaps with an orthographic projection of a portion of the first semiconductor pattern 2111 on the base 10.

In S115, a conductivizing process is performed on the first transition pattern 2110 and a portion of the first semiconductor pattern 2111 that is not covered by the first gate 131, so as to respectively form the second storage electrode 1512 and the first active pattern 134.

That is, the conductivizing process is performed on the portion of the first semiconductor pattern 2111 that is not covered by the first gate 131 to form the first active pattern 134, and is performed on the first transition pattern 2110 to form the second storage electrode 1512.

As shown in part E in FIG. 21, the first active pattern 134 has a first channel region 1341, a first source region 1342 and a first drain region 1343. The first active pattern 134 includes a portion located in the first channel region 1341, a portion located in the first source region 1342 and a portion located in the first drain region 1343. An orthographic projection of the portion of the first active pattern 134 located in the first channel region 1341 on the base 10 overlaps with the orthographic projection of the first gate 131 on the base 10. An orthographic projection of the portion of the first active pattern 134 located in the first source region 1342 on the base 10 and an orthographic projection of the portion located in the first drain region 1343 on the base 10 do not overlap with the orthographic projection of the first gate 131 on the base 10.

An appropriate conductivizing process may be selected according to a material of the semiconductor layer 211.

In some examples, a portion of the semiconductor layer 211 is made to be a conductor by using a chemical vapor deposition (CVD) method. For example, hydrogen ($H_2$) or ammonia ($NH_3$) containing hydrogen (H) atoms are used to perform ion bombardment on the portion of the semiconductor layer 211, so as to remove oxygen (O) ions in this portion, so that this portion is deoxygenated, and becomes the conductor.

In some other examples, the portion of the semiconductor layer 211 made to be a conductor by using a dry etching process. Atoms contained in gas during the dry etching are used to bombard the portion of the semiconductor layer 211 (the dry etching process has no etching effect on metal oxides), so as to break chemical bond between metal and oxygen in molecules in this portion, so that this portion is deoxygenated, and become the conductor. The gas used in the dry etching is, for example, helium. Accordingly, the atoms for bombarding this portion in a metal oxide semiconductor are helium atoms.

In yet other examples, the portion of the semiconductor layer 211 is made to be a conductor by using an ion implantation process. For example, the semiconductor layer 211 is made of polycrystalline silicon (p-Si). In this case, the portion of the semiconductor layer 211 is doped with trivalent ion or pentavalent ions.

The second storage electrode 1512 and the first active pattern 134 are formed by using a same patterning process in combination with the conductivizing process, which not only simplifies the process for manufacturing the substrate, but also saves a manufacturing cost of the substrate.

In some embodiments, with reference to FIGS. 14 to 18, the method for manufacturing the substrate 100 further includes: forming a plurality of pixel driver circuits, each pixel driver circuit including at least one second thin film transistor 14. As for a structure of the second thin film transistor 14, reference may be made to the corresponding description about the structure of the second thin film transistor 14 in the above embodiments, which will not be repeated herein.

A second gate 141 and the first gate 131 are formed through a same patterning process. A second active pattern 144, the first active pattern 134 and the second storage electrode 1512 are formed through a same patterning process in combination with a same conductivizing process. A second source 142, a second drain 143, the first source 132 and the first drain 133 are formed through a same patterning process.

A process of forming the plurality of pixel driver circuits may include the following steps.

Figure 22A:
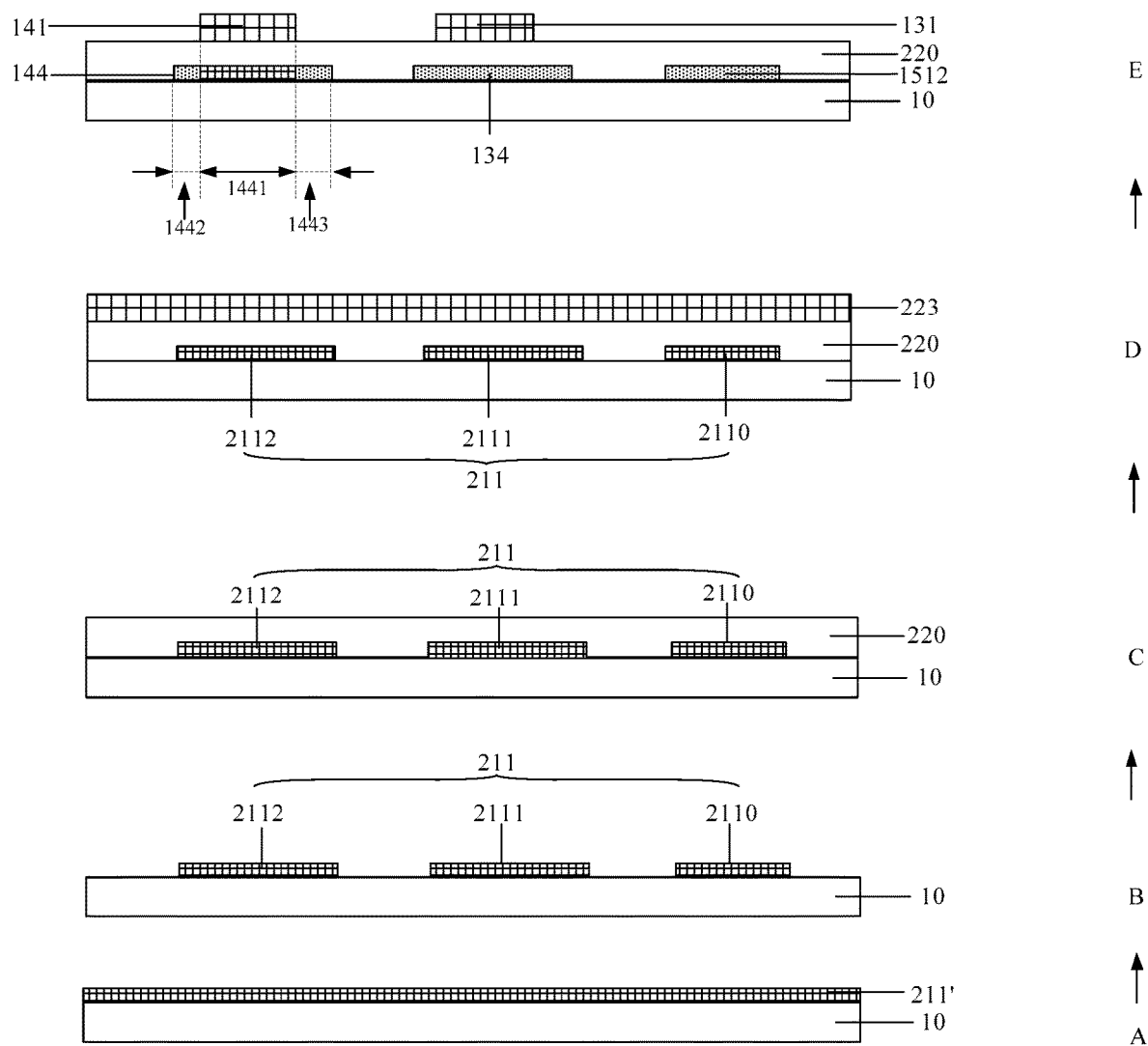
FIG. 22A is a schematic diagram showing a part of structures in a process of manufacturing another substrate, in accordance with some embodiments of the present disclosure.

In a first step, with reference to part A in FIG. 22A, the semiconductor film 211' is formed on the base 10.

In a second step, with reference to part B in FIG. 22A, a first patterning process is performed on the semiconductor film 211' to form the semiconductor layer 211. The semiconductor layer 211 includes first semiconductor patterns 2111, first transition patterns 2110 and second semiconductor patterns 2112.

In a third step, with reference to part C in FIG. 22A, the second gate insulating film 220 is formed on the base 10 on which the semiconductor layer 211 has been formed.

In a fourth step, with reference to part D in FIG. 22A, a first metal film 223 is formed on the base 10 on which the second gate insulating film 220 has been formed, and a second patterning process is performed on the first metal film 223 to form the first gates 131 and the second gates 141 shown in part E in FIG. 22A.

The orthographic projection of the first gate 131 on the base 10 overlaps with an orthographic projection of a portion of the first semiconductor pattern on the base 10. An orthographic projection of the second gate 141 on the base 10 overlaps with an orthographic projection of a portion of the second semiconductor pattern on the base 10.

In a fifth step, with reference to the part E in FIG. 22A, a conductivizing process is performed on the portion of the first semiconductor pattern 2111 that is not covered by the first gate 131, a portion of the second semiconductor pattern 2112 that is not covered by the second gate 141, and the first transition pattern 2110, so as to respectively form the first active pattern 134, the second active pattern 144 and the second storage electrode 1512.

Similar to the first active pattern 134, the second active pattern 144 has a second channel region 1441, a second source region 1442 and a second drain region 1443 that are located on both sides of the second channel region 1441. The second active pattern 144 includes a portion located in the second channel region 1441, a portion located in the second source region 1442, and a portion located in the second drain region 1443. An orthographic projection of the portion of the second active pattern 144 located in the second channel region 1441 on the base 10 overlaps with the orthographic projection of the second gate 141 on the base 10. An orthographic projection of the portion of the second active pattern 144 located in the second source region 1442 on the base 10 and an orthographic projection of the portion of the second active pattern 144 located in the second drain region 1443 on the base 10 do not overlap with the orthographic projection of the second gate 141 on the base 10.

Figure 23:
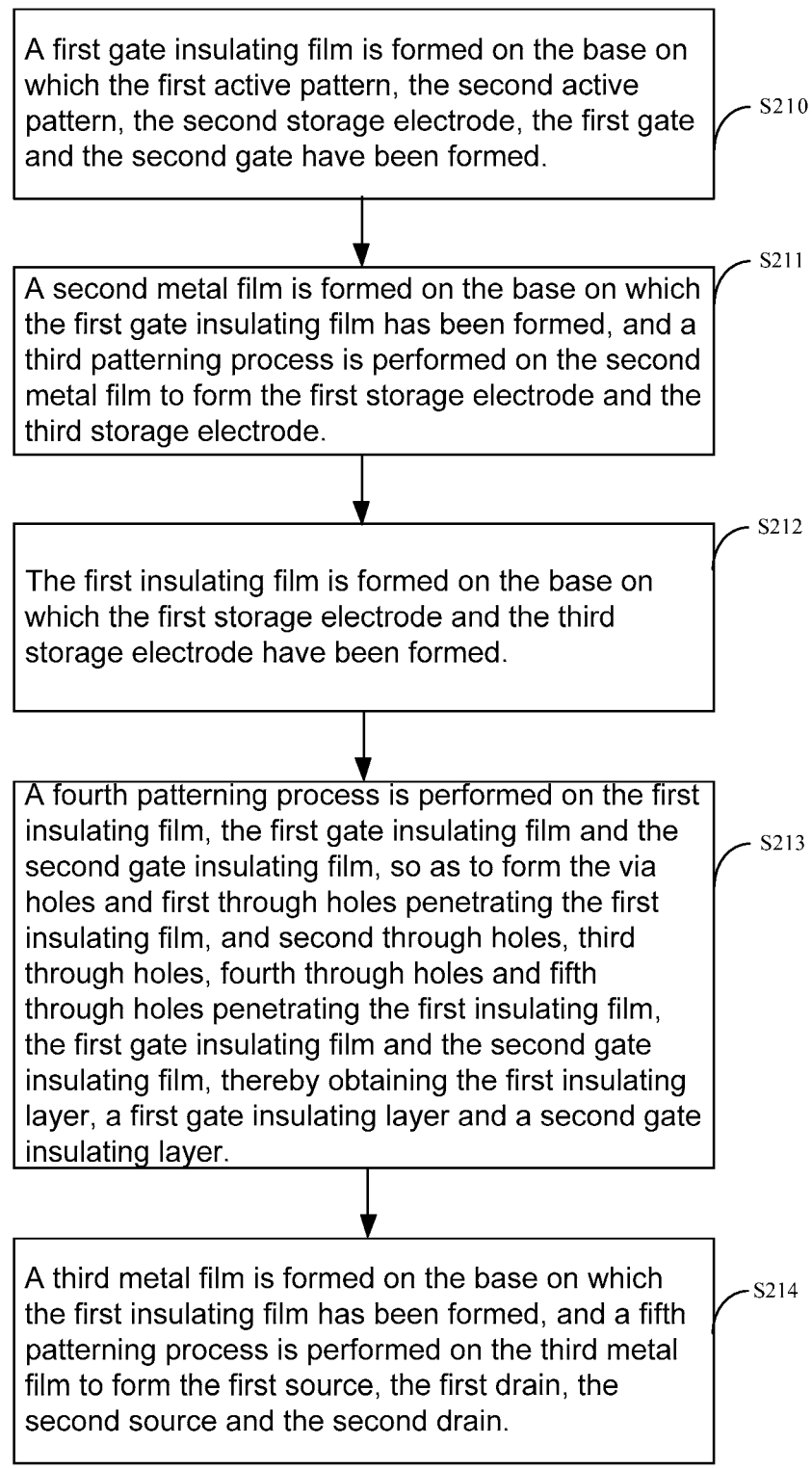
FIG. 23 is a flow diagram showing steps of forming a first insulating layer, a second insulating layer and a gate insulating layer of a substrate, in accordance with some embodiments of the present disclosure.

In some embodiments, as shown in FIGS. 14 to 17, the pixel driver circuit further includes a second storage capacitor 152. The second storage capacitor 152 includes a fourth storage electrode 1522 and a third storage electrode 1521 that are sequentially formed on the base 10. The fourth storage electrode 1522 is further used as the second gate 141. In this case, with reference to FIG. 23, the method further includes S210 to S214.

Figure 22B:
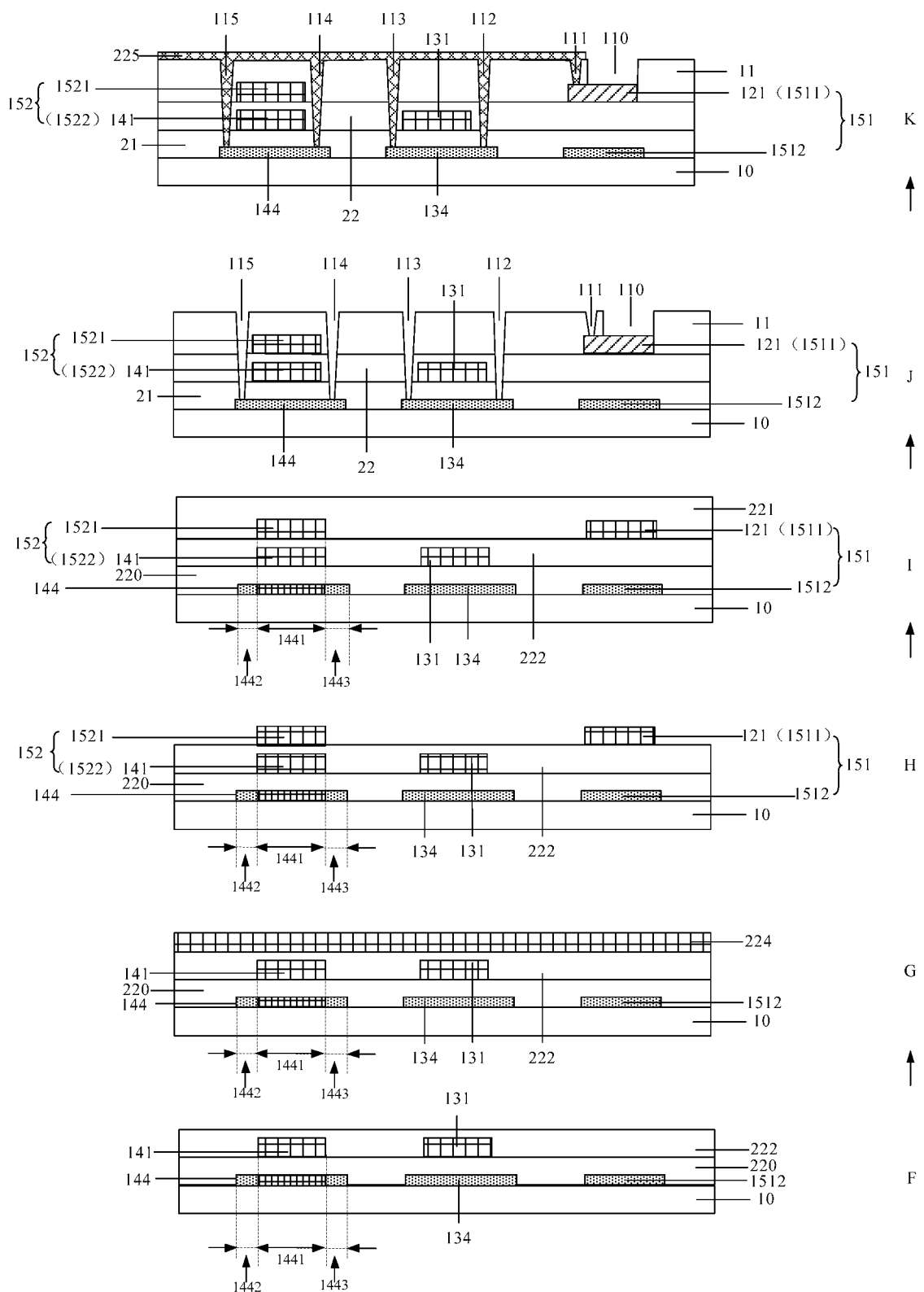
FIG. 22B is a schematic diagram showing another part of structures in a process of manufacturing another substrate, in accordance with some embodiments of the present disclosure.

In S210, as shown in part F in FIG. 22B, a first gate insulating film 222 is formed on the base 10 on which the first active pattern 134, the second active pattern 144, the second storage electrode 1512, the first gate 131 and the second gate 141 have been formed.

In S211, as shown in part G in FIG. 22B, a second metal film 224 is formed on the base 10 on which the first gate insulating film 222 has been formed, and a third patterning process is performed on the second metal film 224 to form the first storage electrode 1511 and the third storage electrode 1521 shown in part H in FIG. 22B.

An orthographic projection of the third storage electrode 1521 on the base 10 overlaps with the orthographic projection of the second gate 141 on the base 10. The second gate 141 and the third storage electrode 1521 constitute the second storage capacitor 152 in the pixel driver circuit. In this case, the second thin film transistor 14 is a driving transistor.

An orthographic projection of the first electrode 121 on the base 10 overlaps with an orthographic projection of the second storage electrode 1512 on the base 10. The first electrode 121 is further used as the first storage electrode 1511. The first electrode 121 (i.e., the first storage electrode 1511) and the third storage electrode 1512 may be formed by using a same patterning process.

In S212, as shown in part I in FIG. 22B, the first insulating film 221 is formed on the base 10 on which the first storage electrode 1511 and the third storage electrode 1521 have been formed.

In S213, a fourth patterning process is performed on the first insulating film 221, the first gate insulating film 222 and the second gate insulating film 220, so as to form the via holes 110 and first through holes penetrating the first insulating film 221, and second through holes 221, third through holes 113, fourth through holes 114 and fifth through holes 115 penetrating the first insulating film 221, the first gate insulating film 222 and the second gate insulating film 220, thereby obtaining the first insulating layer 11, a first gate insulating layer 22 and a second gate insulating layer 21.

In S214, as shown in part K in FIG. 22B, a third metal film 225 is formed on the base 10 on which the first insulating film 221 has been formed, and a fifth patterning process is performed on the third metal film 225 to form the first source 132, the first drain 133, the second source 142 and the second drain 143 shown in FIG. 14.

One of the first source 132 and the first drain 133 is electrically connected to the first active pattern 134 through the second through hole 112. Another of the first source 132 and the first drain 133 is electrically connected to the first active pattern 134 through the third through hole 113. For example, in FIG. 14, the first drain 133 is electrically connected to the first active pattern 134 through the second through hole 112, and the first source 132 is electrically connected to the first active pattern 134 through the third through hole 113.

One of the second source 142 and the second drain 143 is electrically connected to the second active pattern 144 through the fourth through hole 114. Another of the second source 142 and the second drain 143 is electrically connected to the second active pattern 144 through the fifth through hole 115. For example, in FIG. 14, the second drain 143 is electrically connected to the second active pattern 144 through the fourth through hole 114, and the second source 142 is electrically connected to the second active pattern 144 through the fifth through hole 115. Finally, the texture identifier 12 shown in FIG. 14 is formed at a position of a corresponding via hole 110.

In some embodiments, with reference to FIGS. 10 to 17, after the first thin film transistors 13, the pixel driver circuits and the texture identifiers 12 are formed, the method further includes: forming a planarization layer 16 on a side of the first thin film transistors 13, the pixel driver circuits and the texture identifiers 12 that is away from the base 10.

In some embodiments, a thickness of the planarization layer 16 is in a range of 1.2 μm to 1.8 μm. For example, the thickness of the planarization layer 16 may be 1.2 μm, 1.5 μm, 1.7 μm, or 1.8 μm. The planarization layer 16 may be made of, for example, resin.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A substrate, comprising:
a base;
a first insulating layer disposed on the base, the first insulating layer including a plurality of via holes extending toward the base from a surface of the first insulating layer facing away from the base, wherein the plurality of via holes penetrate the first insulating layer;
a plurality of texture identifiers disposed on the base, at least a part of each texture identifier being located within a respective one of the plurality of via holes, and the texture identifier being configured to detect texture information; and
a plurality of first thin film transistors disposed on the base, wherein
at least one first thin film transistor includes a first gate, a first active pattern, a portion of the first insulating layer located in the first thin film transistor, a first source and a first drain; and one of the first source and the first drain is electrically connected to at least one corresponding texture identifier,
the texture identifier includes:
a first electrode disposed on a side of the first insulating layer proximate to the base;
a texture identification functional layer disposed on a surface of the first electrode facing away from the base, at least a part of the texture identification functional layer being disposed in a corresponding via hole, and
a second electrode disposed on a surface of the texture identification functional layer facing away from the base, wherein an area of an orthographic projection of the first electrode on the base is greater than an area of an orthographic projection of the second electrode on the base; and
the first insulating layer is disposed between the first electrode and a layer including the first source and the first drain, the first insulating layer has a plurality of first through holes, and one of the first source and the first drain is electrically connected to a corresponding first electrode through a corresponding first through hole,
the substrate further comprising a plurality of second storage electrodes, each second storage electrode being disposed between the first electrode and the base, wherein
in a thickness direction of the base, the orthographic projection of the first electrode on the base overlaps with an orthographic projection of the second storage electrode on the base,
wherein
the second storage electrode and the first gate are disposed in a same layer, and are made of a same material; or the second storage electrode and the first active pattern are disposed in a same layer;
the first active pattern has a first channel region, and a first source region and a first drain region that are located on two opposite sides of the first channel region, and an orthographic projection of a portion of the first active pattern located in the first channel region on the base overlaps with an orthographic projection of the first gate on the base; the first source is electrically connected to a portion of the first active pattern located in the first source region, and the first drain is electrically connected to a portion of the first active pattern located in the first drain region; and the second storage electrode, the portion of the first active pattern located in the first source region, and the portion of the first active pattern located in the first drain region are made of a same material.

2. The substrate according to claim 1, further comprising a plurality of pixel driver circuits disposed on the base, at least one pixel driver circuit including at least one second thin film transistor; wherein the second thin film transistor includes a second gate, a second active pattern, a portion of the first insulating layer located in the second thin film transistor, a second source and a second drain; and the second gate and the first gate are disposed in a same layer, the second active pattern and the first active pattern are disposed in a same layer, and the second source, the second drain, the first source and the first drain are disposed in a same layer.

3. The substrate according to claim 2, wherein the pixel driver circuit further includes a third storage electrode, wherein in the thickness direction of the base, an orthographic projection of the third storage electrode on the base overlaps with an orthographic projection of the second gate on the base; and the second thin film transistor is a driving transistor.

4. The substrate according to claim 3, wherein the second gate is disposed on a side of the second active pattern away from the base; and the third storage electrode is disposed on a side of the second gate away from the base, and the third storage electrode is disposed in a same layer as the first electrode.

5. The substrate according to claim 4, wherein the third storage electrode is disposed on a surface of the first insulating layer proximate to the base; and the substrate further comprises a first gate insulating layer disposed between the third storage electrode and the second gate.

6. The substrate according to claim 2, further comprising a plurality of light-emitting devices disposed on a side of the plurality of pixel driver circuits away from the base, an anode of each light-emitting device being electrically connected to a corresponding pixel driver circuit.

7. The substrate according to claim 1, further comprising a planarization layer disposed on a side of the plurality of texture identifiers away from the base, wherein in the thickness direction of the base, a thickness of the planarization layer is in a range of 1.2 μm to 1.8 μm.

8. The substrate according to claim 7, further comprising a protective layer disposed on a surface of the planarization layer proximate to the base, wherein the protective layer is made of an inorganic insulating material, and the planarization layer is made of an organic insulating material.

9. A display device, comprising the substrate according to claim 1.

10. A method for manufacturing the substrate according to claim 1, the method comprising:

forming the first insulating layer on the base, the first insulating layer including a plurality of via holes extending toward the base from a surface of the first insulating layer facing away from the base;

forming the plurality of texture identifiers on the base, at least a part of each texture identifier being located within a corresponding via hole in the thickness direction of the base; and forming a plurality of first thin film transistors on the base, wherein each first thin film transistor includes a first gate, a first active pattern, a portion of the first insulating layer located in the first thin film transistor, a first source and a first drain; and one of the first source and the first drain is electrically connected to at least one corresponding texture identifier; and the first source and the first drain are formed directly after the first insulating layer is formed; and before forming the first insulating layer, the method further comprises:

forming a plurality of first storage capacitors, each first storage capacitor including a second storage electrode and a first storage electrode that are sequentially formed on the base in the thickness direction of the base, wherein after forming the first insulating layer, forming the plurality of texture identifiers includes:

forming texture identification functional layers each on a corresponding first storage electrode; and forming second electrodes each on a corresponding texture identification functional layer;

wherein forming the second storage electrode and the first gate includes:

forming a metal film on the base; and performing a patterning process on the metal film to form the second storage electrode and the first gate;

or, forming the second storage electrode, the first active pattern and the first gate includes:

forming a semiconductor film on the base;

performing a patterning process on the semiconductor film to form a semiconductor layer, the semiconductor layer including a first semiconductor pattern and a first transition pattern;

forming a second gate insulating film on the base on which the semiconductor layer has been formed;

forming the first gate on the base on which the second gate insulating film has been formed, an orthographic projection of the first gate on the base overlapping with an orthographic projection of a portion of the first semiconductor pattern on the base; and performing a conductivizing process on the first transition pattern and a portion of the first semiconductor pattern that is not covered by the first gate, to respectively form the second storage electrode and the first active pattern.

11. The method according to claim 10, further comprising:

forming a plurality of pixel driver circuits, each pixel driver circuit including at least one second thin film transistor; and each second thin film transistor including a second gate, a second active pattern, a portion of the first insulating layer located in the second thin film transistor, a second source and a second drain, wherein the second gate and the first gate are formed through a same patterning process;

the second active pattern, the first active pattern and the second storage electrode are formed through a same patterning process and a same conductivizing process; and the second source, the second drain, the first source and the first drain are formed through a same patterning process.

12. The method according to claim 11, wherein the pixel driver circuit further includes a second storage capacitor; the second storage capacitor includes a fourth storage electrode and a third storage electrode that are sequentially formed on the base in the thickness direction of the base; and the second thin film transistor is a driving transistor, and the fourth storage electrode is further used as the second gate; and forming the first thin film transistor, the second thin film transistor, the first storage electrode and the second storage electrode includes:

forming the semiconductor film on the base;

performing a first patterning process on the semiconductor film to form the semiconductor layer, the semiconductor layer including the first semiconductor pattern, the first transition pattern and second semiconductor pattern;

forming the second gate insulating film on the base on which the semiconductor layer has been formed;

forming a first metal film on the base on which the second gate insulating film has been formed;

performing a second patterning process on the first metal film to form the first gate and the second gate, wherein the orthographic projection of the first gate on the base overlaps with an orthographic projection of a portion of the first semiconductor pattern on the base, and an orthographic projection of the second gate on the base overlaps with an orthographic projection of a portion of the second semiconductor pattern on the base;

performing a conductivizing process on the portion of the first semiconductor pattern that is not covered by the first gate, a portion of the second semiconductor pattern that is not covered by the second gate and the first transition pattern, so as to respectively form the first active pattern, the second active pattern and the second storage electrode;

forming a first gate insulating film on the base on which the first active pattern, the second active pattern and the second storage electrode have been formed;

forming a second metal film on the base on which the first gate insulating film has been formed;

performing a third patterning process on the second metal film to form the first storage electrode and the third storage electrode;

forming a first insulating film on the base on which the first storage electrode and the third storage electrode have been formed;

performing a fourth patterning process on the first insulating film, the first gate insulating film and the second gate insulating film, so as to form the via holes and a first through hole penetrating the first insulating film, and a second through hole, a third through hole, a fourth through hole and a fifth through hole penetrating the first insulating film, the first gate insulating film and the second gate insulating film, thereby sequentially obtaining the first insulating layer, a first gate insulating layer and a second gate insulating layer;

forming a third metal film on the base on which the first insulating film has been formed; and performing a fifth patterning process on the third metal film to form the first source, the first drain, the second source and the second drain, wherein the first drain and the first source are in contact with a portion of the first active pattern that is not covered by the first gate through the second through hole and the third through hole respectively, the second drain and the second source are in contact with a portion of the second active pattern that is not covered by the second gate through the fourth through hole and the fifth through hole respectively, and one of the first drain and the first source is electrically connected to the first storage electrode through the first through hole.

* * * * *